United States Patent
Yeo et al.

(10) Patent No.: US 8,062,946 B2
(45) Date of Patent: Nov. 22, 2011

(54) STRAINED CHANNEL TRANSISTOR STRUCTURE WITH LATTICE-MISMATCHED ZONE AND FABRICATION METHOD THEREOF

(75) Inventors: Yee-Chia Yeo, Singapore (SG);
Chun-Chieh Lin, Taichung (TW);
Wen-Chin Lee, Hsinchu (TW);
Chenming Hu, Alamo, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1358 days.

(21) Appl. No.: 11/093,847

(22) Filed: Mar. 30, 2005

(65) Prior Publication Data
US 2005/0170594 A1    Aug. 4, 2005

Related U.S. Application Data

(62) Division of application No. 10/379,033, filed on Mar. 4, 2003, now Pat. No. 6,921,913.

(51) Int. Cl.
*H01L 21/336* (2006.01)

(52) U.S. Cl. . 438/285; 438/305; 438/595; 257/E21.131; 257/E21.431; 257/E21.435; 257/E21.619

(58) Field of Classification Search .......... 438/230–231, 438/300, 303, 305, 595, 285; 257/E21.131, 257/E21.431, E21.435, E21.438, E21.619
See application file for complete search history.

(56) References Cited

U.S. PATENT DOCUMENTS

| | | | | |
|---|---|---|---|---|
| 5,683,934 A | | 11/1997 | Candelaria | 438/151 |
| 5,710,450 A | * | 1/1998 | Chau et al. | 257/344 |
| 5,714,777 A | | 2/1998 | Ismail et al. | 257/263 |
| 6,071,783 A | * | 6/2000 | Liang et al. | 438/301 |
| 6,127,233 A | * | 10/2000 | Rodder | 438/300 |
| 6,190,975 B1 | | 2/2001 | Kubo et al. | 438/285 |
| 6,274,894 B1 | * | 8/2001 | Wieczorek et al. | 257/192 |
| 6,406,973 B1 | | 6/2002 | Lee | 438/416 |
| 6,437,375 B1 | | 8/2002 | Beaman | 257/192 |
| 6,492,216 B1 | * | 12/2002 | Yeo et al. | 438/197 |
| 6,495,402 B1 | * | 12/2002 | Yu et al. | 438/149 |
| 6,504,214 B1 | * | 1/2003 | Yu et al. | 257/347 |
| 6,509,241 B2 | * | 1/2003 | Park et al. | 438/303 |
| 6,531,347 B1 | * | 3/2003 | Huster et al. | 438/164 |

(Continued)

FOREIGN PATENT DOCUMENTS

CN   1123470 A   5/1996

(Continued)

OTHER PUBLICATIONS

China Patent Office Action.

*Primary Examiner* — Mary Wilczewski
*Assistant Examiner* — Toniae Thomas
(74) *Attorney, Agent, or Firm* — Thomas|Kayden

(57) ABSTRACT

A strained-channel transistor structure with lattice-mismatched zone and fabrication method thereof. The transistor structure includes a substrate having a strained channel region, comprising a first semiconductor material with a first natural lattice constant, in a surface, a gate dielectric layer overlying the strained channel region, a gate electrode overlying the gate dielectric layer, and a source region and drain region oppositely adjacent to the strained channel region, with one or both of the source region and drain region comprising a lattice-mismatched zone comprising a second semiconductor material with a second natural lattice constant different from the first natural lattice constant.

32 Claims, 19 Drawing Sheets

U.S. PATENT DOCUMENTS

| | | | |
|---|---|---|---|
| 6,599,803 B2 * | 7/2003 | Weon et al. | 438/300 |
| 6,657,223 B1 * | 12/2003 | Wang et al. | 257/19 |
| 6,703,648 B1 * | 3/2004 | Xiang et al. | 257/192 |
| 6,743,684 B2 * | 6/2004 | Liu | 438/300 |
| 6,797,556 B2 * | 9/2004 | Murthy et al. | 438/231 |
| 6,812,103 B2 * | 11/2004 | Wang et al. | 438/300 |
| 6,858,505 B2 * | 2/2005 | Park | 438/301 |
| 6,885,084 B2 * | 4/2005 | Murthy et al. | 257/622 |
| 6,887,762 B1 * | 5/2005 | Murthy et al. | 438/300 |
| 7,132,338 B2 * | 11/2006 | Samoilov et al. | 438/300 |
| 7,208,362 B2 * | 4/2007 | Chidambaram | 438/199 |
| 7,335,929 B2 * | 2/2008 | Lin et al. | 257/192 |
| 2002/0123183 A1 | 9/2002 | Fitzgerald | 438/199 |
| 2003/0057416 A1 | 3/2003 | Currie et al. | 257/19 |
| 2004/0072395 A1 * | 4/2004 | Liu | 438/197 |
| 2004/0262694 A1 * | 12/2004 | Chidambaram | 257/369 |
| 2006/0024876 A1 * | 2/2006 | Chidambaram et al. | 438/198 |
| 2006/0081875 A1 * | 4/2006 | Lin et al. | 257/190 |
| 2007/0018205 A1 * | 1/2007 | Chidambarrao et al. | 257/288 |
| 2007/0026599 A1 * | 2/2007 | Peidous et al. | 438/199 |
| 2007/0034945 A1 * | 2/2007 | Bohr et al. | 257/338 |
| 2007/0096195 A1 * | 5/2007 | Hoentschel et al. | 257/315 |
| 2007/0096201 A1 * | 5/2007 | Ning | 257/321 |
| 2011/0014765 A1 * | 1/2011 | Fukuda et al. | 438/285 |

FOREIGN PATENT DOCUMENTS

| | | | |
|---|---|---|---|
| WO | WO 00/30169 | * | 5/2000 |

* cited by examiner

STRAINED CHANNEL TRANSISTOR STRUCTURE WITH LATTICE-MISMATCHED ZONE AND FABRICATION METHOD THEREOF

CROSS-REFERENCE TO RELATED APPLICATION

This application is a divisional of U.S. patent application Ser. No. 10/379,033, filed Mar. 4, 2003, now U.S. Pat. No. 6,921,913.

BACKGROUND OF THE INVENTION

1. Field of the Invention

The present invention relates to a semiconductor device with lattice-mismatched zone and fabrication method thereof, and more specifically to a strained-channel transistor structure and fabrication method thereof.

2. Description of the Related Art

Size reduction of the metal-oxide-semiconductor field-effect transistor (MOSFET), including reduction of gate length and gate oxide thickness, has enabled a continuous improvement in speed performance, density, and cost per unit function of integrated circuits during the past few decades.

In order to further enhance performance of the transistor, strain may be introduced in the transistor channel to improve carrier mobility to enhance performance of the transistor in addition to device scaling. There are several existing approaches to introducing strain in a channel region of the transistor.

In one conventional approach, as described in a paper titled "NMOS and PMOS transistors fabricated in strained silicon/relaxed silicon-germanium structures", disclosed by J. Welser et al., published at the December 1992 International Electron Devices Meeting held in San Francisco, Calif., pp. 1000-1002, a relaxed silicon germanium (SiGe) buffer layer 110 is provided beneath channel region 126, as shown in FIG. 1A. In FIG. 1B and FIG. 1C, a simple model of different lattice constants is used to show the intersection between relaxed SiGe layer 114 of buffer layer 110 and strained-Si layer 130. In FIG. 1B, model 135 shows the natural lattice constant of Si, smaller than that of SiGe shown by model 115. In FIG. 1C, when a thin layer of epitaxial Si (model 135) is grown on relaxed SiGe layer 114 (model 115), unit cell 136 of Si shown in model 135 is stretched laterally so as to be under a biaxial tensile strain. The thin layer of epitaxial Si becomes strain-Si layer 130 shown in FIG. 1A. In FIG. 1A, a transistor formed on the epitaxial strained-Si layer 130 is therefore with a channel region 126 under the biaxial tensile strain. In this approach, relaxed SiGe layer 114 is a stressor that introduces strain in channel region 126. The stressor, in this case, is placed below channel region 126. Significant mobility enhancement has been reported for both electrons and holes in bulk transistors using a silicon channel under biaxial tensile strain. In the aforementioned approach, the epitaxial silicon layer 130 is strained before forming the transistor. Therefore, there are some concerns about possible strain relaxation in the subsequent high temperature CMOS, processes. Further, the approach is very expensive since SiGe buffer layer 110 with thickness in the order of micrometers has to be grown. Numerous dislocations exist in relaxed SiGe layer 114, some of which propagate to strained-Si layer 130, resulting in high defect density, thereby negatively affecting transistor performance.

In another approach, strain in a channel region is introduced after a transistor is formed. In this approach, a high stress film 220 is formed over a completed transistor structure 250, as shown in FIG. 2. High stress film 220, being a stressor, exerts significant influence on channel region 206, modifying silicon lattice spacing in channel region 206, and thus introducing strain in channel region 206. In this case, the stressor is placed above completed transistor structure 250, described in detail in a paper disclosed by A. Shimizu et al., entitled "Local mechanical stress control (LMC): a new technique for CMOS performance enhancement", published in pp. 433-436 of the Digest of Technical Papers of the 2001 International Electron Device Meeting. The strain contributed by high stress film 220 is believed to be uniaxial in nature with a direction parallel to a source-to-drain direction However, uniaxial tensile strain in the source-to-drain degrades hole mobility while uniaxial compressive strain degrades electron mobility. Ion implantation of germanium can be used to selectively relax the strain so that the hole or electron mobility is not degraded, but can be difficult to implement due to the close proximity of the N and P-channel transistors.

SUMMARY OF THE INVENTION

Thus, the main object of the present invention is to provide a transistor structure with a strained channel region.

Another object of the present invention is to provide a strained-channel transistor structure where portions of one or both of a source region and drain region adjacent to a strained channel region are lattice mismatched with respect to the channel region.

Another object of the present invention is to provide a fabrication method of a strained-channel transistor structure.

In order to achieve the above objects, the present invention provides a strained-channel transistor structure comprising a strained channel region, a gate dielectric layer, a gate electrode, and a source region and drain region. The substrate comprises a first semiconductor material with a first natural lattice constant. The gate dielectric layer is on the strained channel region. The gate electrode is on the gate dielectric layer. The source region and drain region are oppositely adjacent to the strained channel region. One or both of the source region and drain region comprise a lattice-mismatched zone comprising a second semiconductor material with a second natural lattice constant different from the first natural lattice constant.

The present invention further provides a fabrication method of a strained-channel transistor structure. First, a substrate having a channel region, comprising a first semiconductor material with a first natural lattice constant, in a surface, a gate dielectric on the channel region, and a gate electrode on the gate dielectric layer is provided. Then, a first source region and drain region are formed oppositely adjacent to the channel region. Next, a spacer is formed on a sidewall of the gate electrode, covering a part of the surface of the substrate. Next, the surface of the substrate not covered by the spacer and gate electrode is recessed. Further, the recess is filled with a second semiconductor material with a second natural lattice constant different from the first natural lattice constant as a lattice-mismatched zone straining the channel region. Finally, a second source region is formed adjacent to the first source region and a second drain region is formed adjacent to the first drain region, one or both of the second source region and second drain region comprising the lattice-mismatched zone.

The present invention further provides a fabrication method of a strained-channel transistor structure. First, a substrate having a channel region, comprising a first semiconductor material with a first natural lattice constant, in a surface, a gate dielectric on the channel region, a gate electrode on the gate dielectric layer, a source region and drain region oppositely adjacent to the channel region, and a spacer on a sidewall of the gate electrode, covering a part of the surface of the substrate, is provided. Then, one or both of the source region and drain region is recessed. Finally, the recess is filled with a second semiconductor material with a second natural lattice constant different from the first natural lattice constant as a lattice-mismatched zone straining the channel region.

The present invention further provides a fabrication method of a strained-channel transistor structure. First, a substrate having a channel region, comprising a first semiconductor material with a first natural lattice constant, in a surface, a gate dielectric on the channel region, a gate electrode on the gate dielectric layer, and a spacer on a sidewall of the gate electrode, covering a part of the surface of the substrate, is provided. Then, the surface of the substrate not covered by the spacer and gate dielectric layer is recessed to form a recess. Finally, a source region and drain region are formed oppositely adjacent to the channel region, one or both of the source region and drain region comprising the lattice-mismatched zone.

The present invention further provides a fabrication method of a strained-channel transistor structure. First, a substrate having a channel region, comprising a semiconductor material, in a surface, a gate dielectric on the channel region, a gate electrode on the gate dielectric layer, a source region and drain region oppositely adjacent to the channel region, and a spacer on a sidewall of the gate electrode, covering a part of the surface of the substrate, is provided. Finally, an element with an atomic size different from that of the semiconductor material is implanted to form a lattice-mismatched zone in one or both of the source region and drain region straining the channel region.

BRIEF DESCRIPTION OF THE DRAWINGS

The present invention can be more fully understood by reading the subsequent detailed description in conjunction with the examples with references made to the accompanying drawings, wherein.

DETAILED DESCRIPTION OF THE INVENTION

The following embodiments are intended to illustrates the invention more fully without limiting their scope, since numerous modifications and variations will be apparent to those skilled in this art.

First Embodiment

In the first embodiment of the present invention, two kinds of stress modes exerted on the strained-channel region according to the present invention are discussed.

Figure 3A:
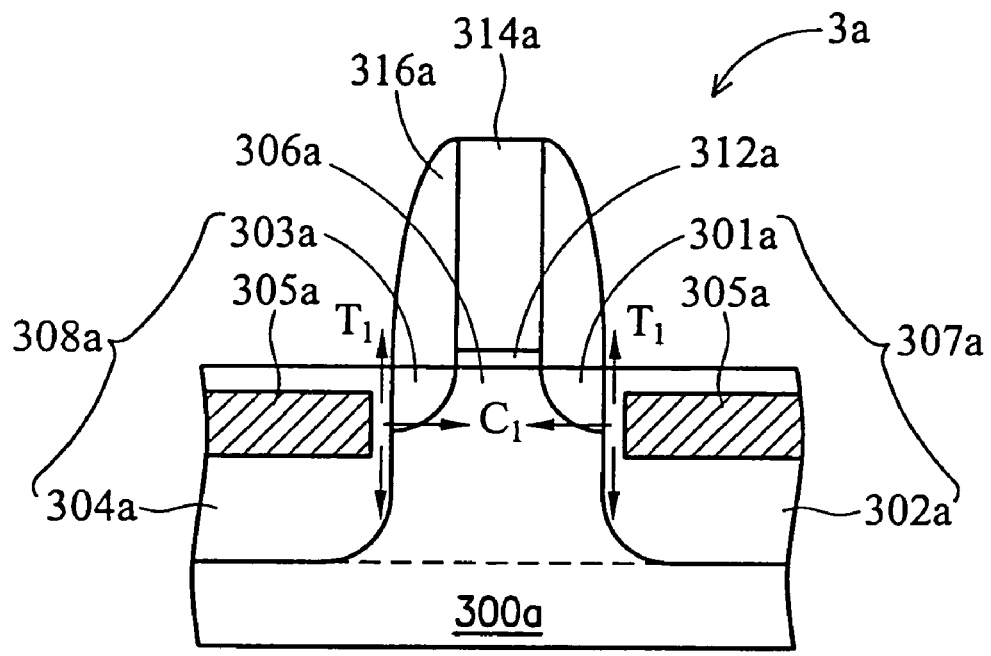
FIG. 3A and FIG. 3B are cross sections illustrating strained-channel transistor structures in accordance with the first embodiment of the present invention.

In FIG. 3A, a cross section of a strained-channel transistor structure $3a$ in accordance with the first embodiment of the present invention is shown. Substrate $300a$, having a strained channel region $306a$ in a surface, comprises a semiconductor material. Gate dielectric layer $312a$, preferably with a thickness between about 3 and 100 Å, is on the strained channel region $306a$. Gate electrode $314a$ is on the gate dielectric layer $312a$. Spacer $316a$ is on a sidewall of gate electrode $314a$ and covers a part of the surface of substrate $300a$. Drain region $307a$, comprising drain extension region $301a$ and deeper drain region $302a$, and source region $308a$, comprising source extension region $303a$ and deeper source region $304a$, are oppositely adjacent to strained channel region $306a$. Lattice-mismatched zone $305a$, comprising another semiconductor material with a natural lattice constant different from that of substrate $300a$, may be in one or both of the deeper drain region $302a$ and deeper source region $304a$. Strained channel region $306a$ is therefore strained by the different lattice constants of strained channel region $306a$ and lattice-mismatched zone $305a$.

In strained-channel transistor structure $3a$ in accordance with the first embodiment of the present, invention, substrate $300a$ preferably comprises silicon, with a natural lattice constant of approximately 5.431 Å, and lattice-mismatched zone $305a$ preferably comprises an alloy semiconductor material such as a silicon-germanium alloy, with a natural lattice constant between about 5.431 Å to 5.657 Å depending on concentration of germanium in the silicon-germanium alloy, larger than that of substrate $300a$. Molar fraction of germanium in the silicon-germanium alloy of lattice-mismatched zone $305a$ in accordance with the first embodiment of the present invention is preferably between about 0.1 and 0.9. Therefore, lattice-mismatched zone $305a$ as a stressor exerts a compressive stress $C_1$ in a source-to-drain direction and tensile stress $T_1$ in a vertical direction on the strained channel region $306a$, resulting in strained channel region $306a$ under a compressive strain in the source-to-drain direction and tensile strain in the vertical direction. Hole mobility in the strained channel region $306a$ is significantly enhanced, enhancing drive current when strained-channel transistor structure 3a in accordance with the first embodiment of the present invention is a P-channel transistor structure.

Figure 3B:
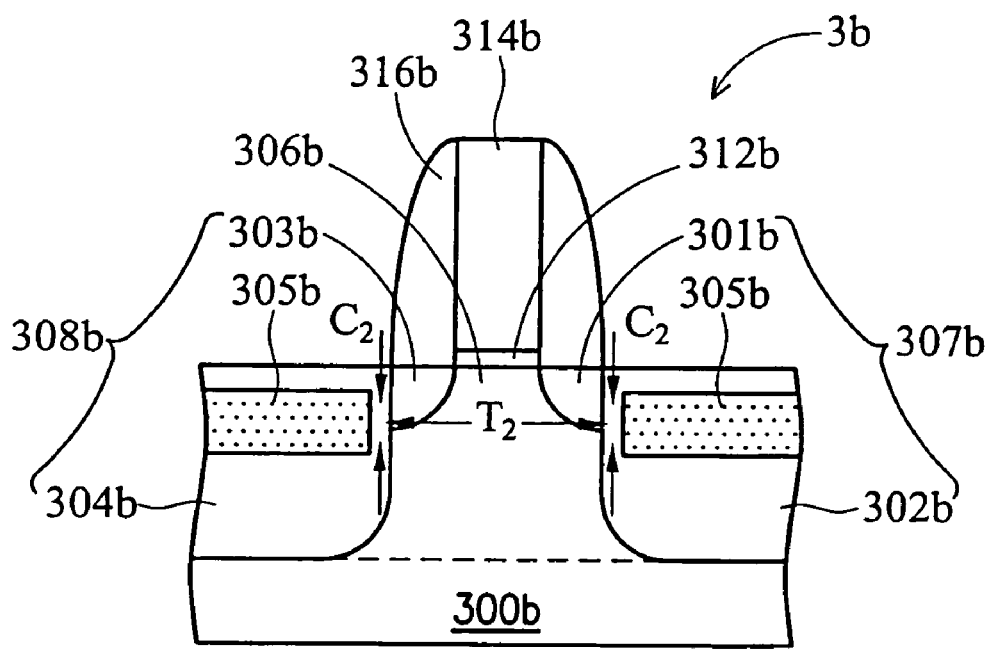

In FIG. 3B, a cross section of a strained-channel transistor structure 3b in accordance with the first embodiment of the present invention is shown. Substrate 300b, having a strained channel region 306b in a surface, comprises a semiconductor material. Gate dielectric layer 312b, preferably-with a thickness between about 3 and, 100 Å, is on the strained channel region 306b. Gate electrode 314b is on the gate dielectric layer 312b. Spacer 316b is on a sidewall of gate electrode 314b and covers a part of the surface of substrate 300b. Drain region 307b, comprising drain extension region 301b and deeper drain region 302b, and source region 308b, comprising source extension region 303b and deeper source region 304b, are oppositely adjacent to strained channel region 306b. Lattice-mismatched zone 305b, comprising another semiconductor material with a natural lattice constant different from that of substrate 300b, may be in one or both of the deeper drain region 302b and deeper source region 304b. Strained channel region 306b is therefore strained by the difference lattice constants of strained channel region 306b and lattice-mismatched zone 305b.

In strained-channel transistor structure 3b in accordance with the first embodiment of the present invention, substrate 300b preferably comprises silicon and lattice-mismatched zone 305b preferably comprises an alloy semiconductor material such as a silicon-carbon alloy, with a natural lattice constant smaller than that of substrate 300b. Molar fraction of carbon in the silicon-carbon alloy of lattice-mismatched zone 305b in accordance with the first embodiment of the present invention is preferably between about 0.01 and 0.04. Therefore, lattice-mismatched zone 305b as a stressor exerts a tensile stress T2 in a source-to-drain direction and compressive stress C2 in a vertical direction on the strained channel region 306b, resulting in strained channel region 306b under a tensile strain in the source-to-drain direction and compressive strain in the vertical direction. Electron mobility in the strained channel region 306b is significantly enhanced, enhancing drive current when strained-channel transistor structure 3b in accordance with the first embodiment of the present invention is an N-channel transistor structure. Furthermore, lattice-mismatched zone 305b may further comprise germanium as a silicon-germanium-carbon alloy, in which molar fraction of carbon is more than a tenth of that of germanium.

Further, compressive strain and tensile strain of strained channel region 306a in FIG. 3A and strained channel region 306b in FIG. 3B are about 0.1% to 4%, preferably about 1% to 4%. Both lattice-mismatched zone 305a in FIG. 3A and lattice-mismatched zone 305b in FIG. 3B are about 10 Å and 1000 Å thick. Compressive strain and tensile strain of strained channel region 306a in FIG. 3A and strained channel region 306b in FIG. 3B are dependent on lattice constants of lattice-mismatched zones 306a and 306b, thicknesses of lattice-mismatched zones 306a and 306b, and arrangement of lattice-mismatched zone 306a in drain region 307a and/or source region 308a, and lattice-mismatched zone 306b in drain region 307b and/or source region 308b.

Second Embodiment

In the second embodiment of the present invention, different kinds of arrangements of lattice-mismatched zone in drain region and/or source region according to the present invention are discussed. In strained-channel transistor structures 4a through 4d in FIGS. 4A through 4D, relationships among substrate 400, drain extension region 401, deeper drain region 402, drain region 407, source extension region 403, deeper source region 404, source region 408, lattice-mismatched zone 405a/405b/405c/405d, strained channel region 406a/406b/406c/406d, gate is dielectric layer 412, gate electrode 414, and spacer 416, the same as those described in the first embodiment of the present invention, are omitted.

Figure 4A:
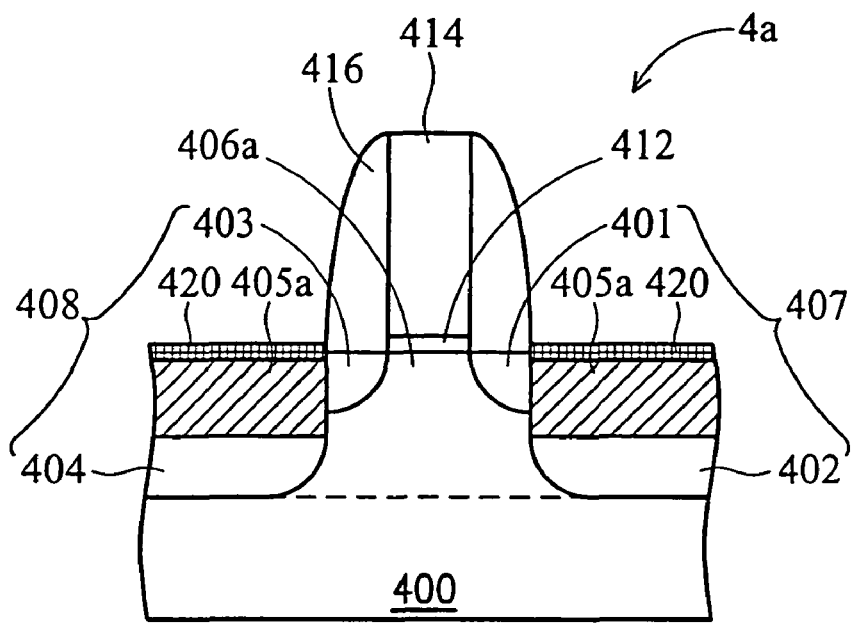
FIGS. 4A through 4D are cross sections illustrating strained-channel transistor structures in accordance with the second embodiment of the present invention.
Figure 4B:
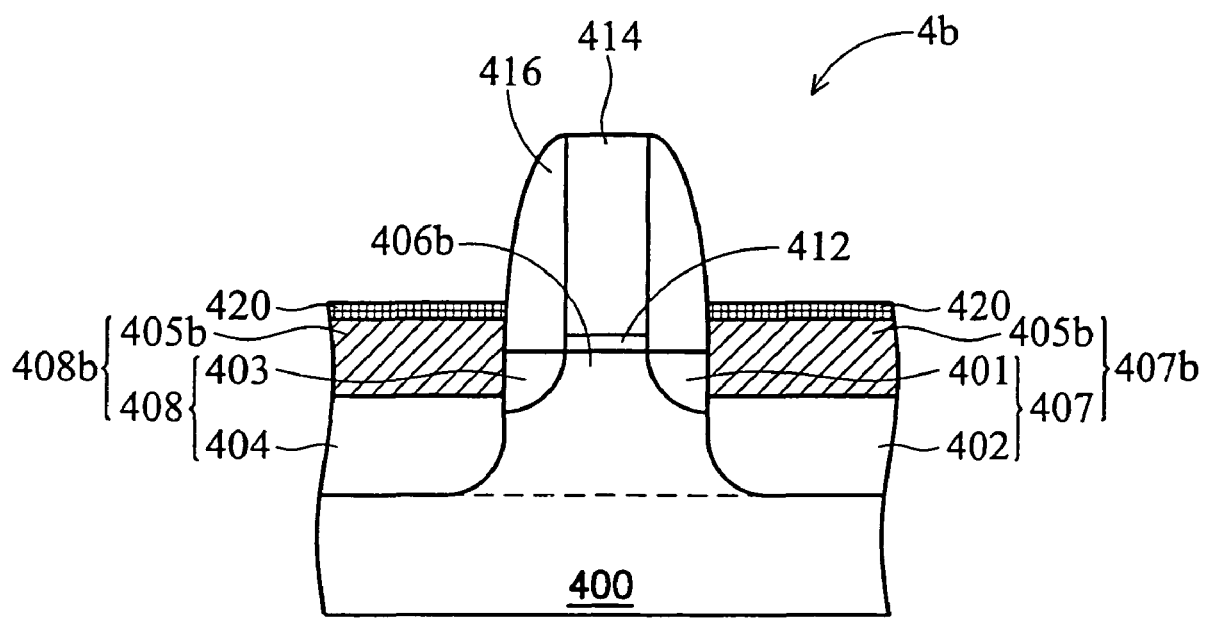
Figure 4C:
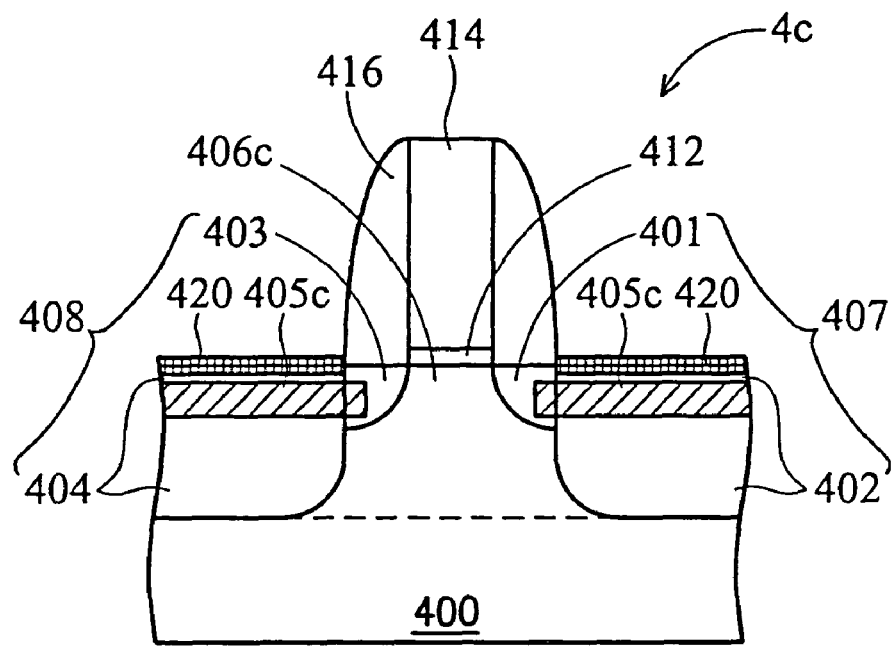
Figure 4D:
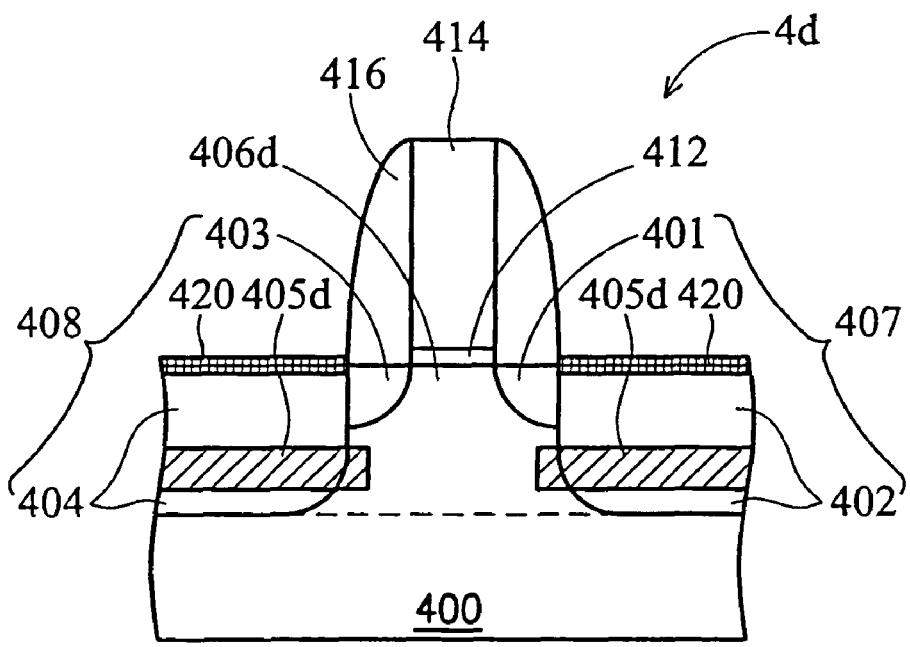

In FIG. 4A, lattice-mismatched zone 405a is arranged near the surface of drain region 407 and/or source region 408, and does not extend into drain extension region 401 and/or source extension region 403. In FIG. 4B, lattice-mismatched zone 405b may protrude from the surface of drain region 407 and/or source region 408, forming a raised drain region 407b and raised source region 408b. In FIG. 4C, lattice-mismatched zone 405c is arranged near the surface of drain region 407 and/or source region 408, and may further extend into drain extension region 401 and/or source extension region 403. In FIG. 4D, lattice-mismatched zone 405d is arranged more deeply from the surface of drain region 407 and/or source region 408, and may further extend into strained channel region 406d beneath drain extension region 401 and/or source extension region 403. Note that the arrangements of lattice-mismatched zone in drain region and/or source region in accordance with the first embodiment of the present invention are not meant to be restrictive. Those skilled in the art may further adjust the arrangement of lattice-mismatched zone according to the present invention when required.

In FIGS. 4A through 4D, a conductive layer 420 such as silicon, metal, metal silicide, or combinations thereof is optionally formed on the surface of drain region 407 and/or source region 408 of strained-channel transistor structures 4a, 4c, and 4d, and raised drain region 407b and/or raised source region 408b of strained-channel transistor structure 4b.

Moreover, enhancement of either electron or hole mobility in strained-channel structure 4c in FIG. 4C is further improved because lattice-mismatched zone 405c is closer to strained channel region 406c, resulting in lattice-mismatched zone 405c exerting more strain on strained channel region 406c.

Third Embodiment

Figure 5:
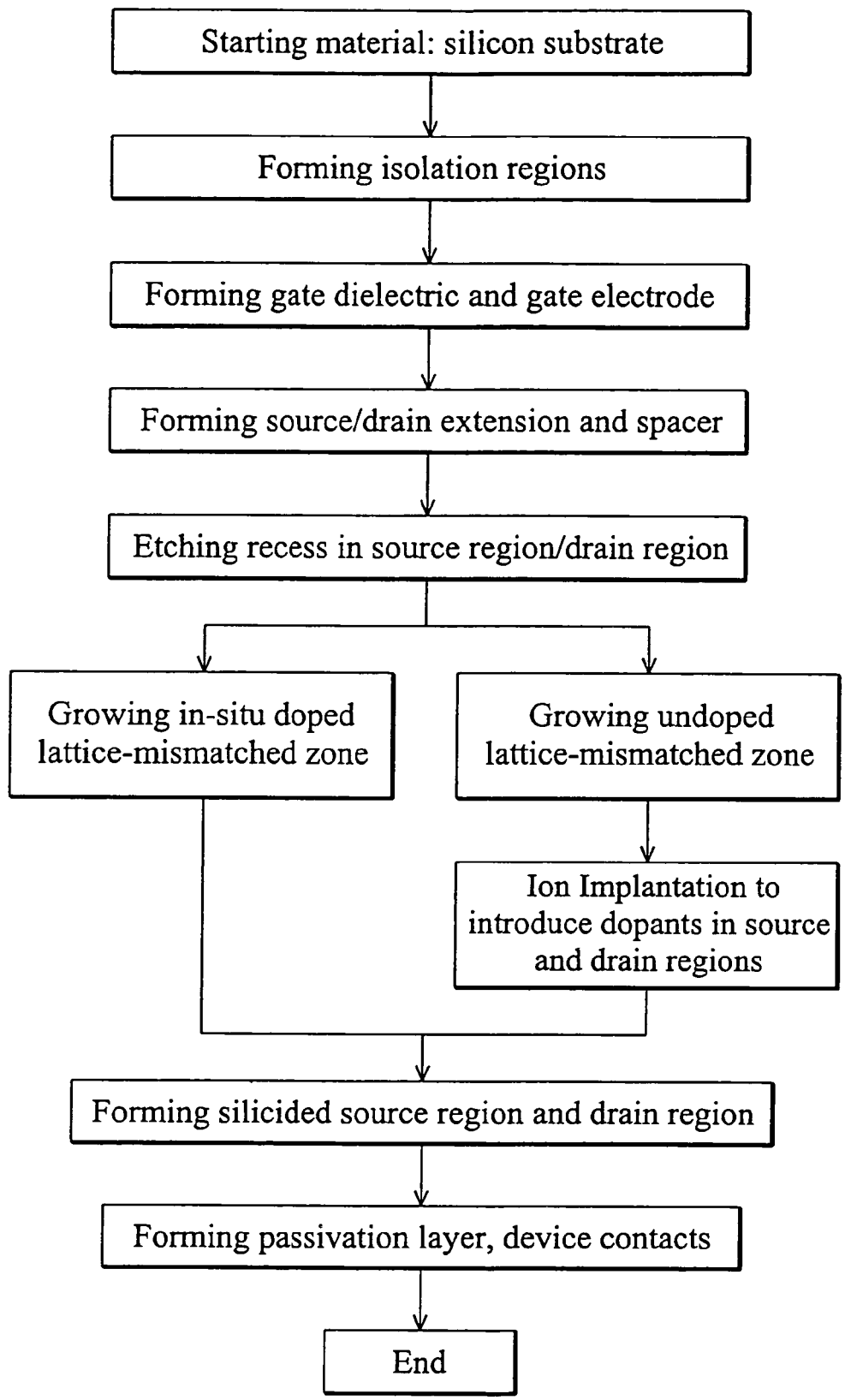
FIG. 5 is a flowchart illustrating, in detail, the fabrication method of a strained-channel transistor structure in accordance with the third embodiment of the present invention.

In the third embodiment of the present invention, a fabrication method of a strained-channel transistor structure according to the present invention is described. A flowchart of the fabrication method in accordance with the third embodiment of the present invention is shown in FIG. 5. The subsequent descriptions of the fabrication method in accordance with the third embodiment of the present invention follow the steps in FIG. 5.

Figure 6A:
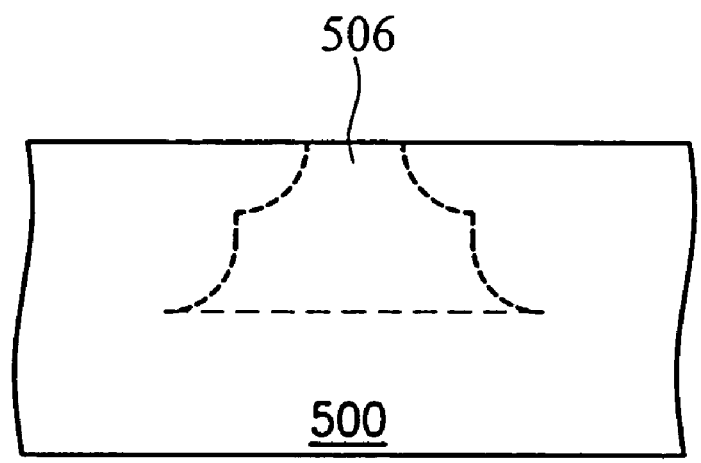
FIGS. 6A through 6F are cross sections illustrating steps of the fabrication method of a strained-channel transistor structure in accordance with the third embodiment of the present invention.

In FIG. 6A, a semiconductor substrate such as a silicon substrate 500 is provided. Silicon substrate 500 comprises a previously formed plurality of isolation regions (not shown) and previously defined plurality of device regions (not shown). For example, the isolation regions may be shallow trench isolation regions. FIGS. 6A through 6F provide a cross-sectional view of one single device region for easy description. Silicon substrate 500 comprises a channel region 506 in an active surface. Silicon substrate 500 is N-type doped when strained-channel transistor structure 5 in FIG. 6E is a P-channel transistor structure, or P-type doped when strained-channel transistor structure 5 in FIG. 6E is an N-channel transistor structure.

Figure 6B:
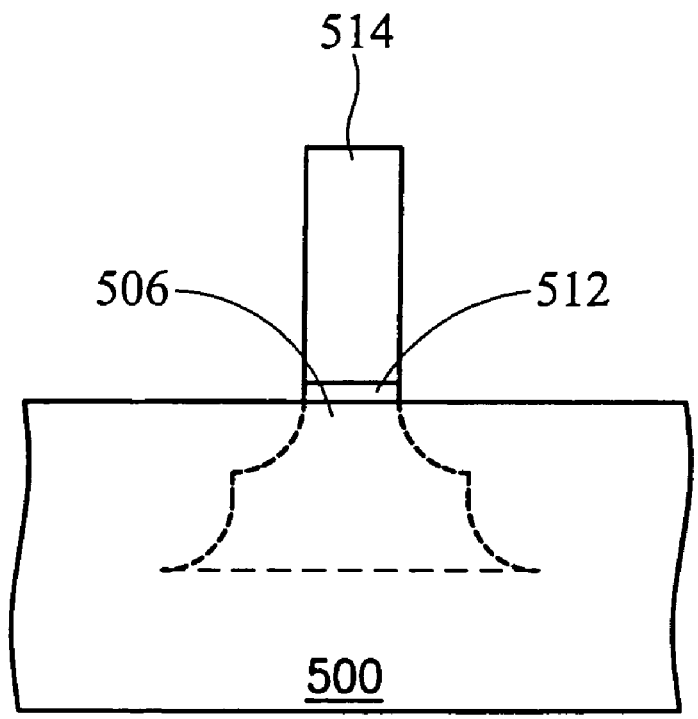

In FIG. 6B, a gate dielectric layer 512 is formed on the channel region 506, and then a gate electrode 514 is formed on the gate dielectric layer 512. Gate dielectric layer 512 is formed by thermal oxidation, thermal oxidation followed by nitridation, chemical vapor deposition, physical vapor deposition such as sputtering, or other known techniques to form a gate dielectric layer. Gate dielectric layer 512 can be silicon dioxide, silicon oxynitride, or combinations thereof with a thickness between about 3 Å to 100 Å, preferably approximately 10 Å or less. Gate dielectric layer 512 may be a high permittivity (high-k) material such as aluminum oxide ($Al_2O_3$), hafnium oxide ($HfO_2$), zirconium oxide ($ZrO_2$), hafnium oxynitride (HfON), hafnium silicate ($HfSiO_4$), zirconium silicate ($ZrSiO_4$), lanthanum oxide ($La_2O_3$), or combinations thereof with an equivalent oxide thickness between about 3 Å to 100 Å. Gate electrode 514 is polycrystalline-silicon (poly-Si), poly-crystalline S silicon-germanium (poly-SiGe), refractory metal such as molybdenum or tungsten, compounds such as titanium nitride, combinations thereof or other conductive materials(s). Implants known as workfunction implants may be introduced in gate electrode 514 to alter the workfunction thereof. Gate electrode 514 is formed by depositing a gate electrode material layer (not shown) over substrate 500, depositing a gate mask (not shown) over the gate electrode material layer, patterning the gate mask to define gate electrode 514, etching the gate electrode material layer to form gate age electrode 514, and removing the gate mask. Gate electrode 514 is electrically isolated from channel region 506 by gate dielectric layer 512. Gate dielectric layer 512 is preferably silicon oxynitride and gate electrode 514 is preferably poly-silicon etched using chlorine and bromine chemistry with a high etch selectivity with respect to gate dielectric later 514 in accordance with the third embodiment of the present invention.

Figure 6C:
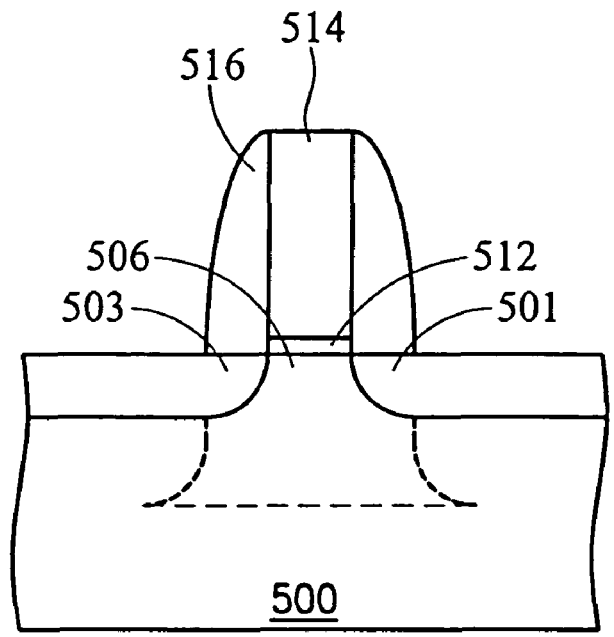

In FIG. 6C, a drain extension region 501 and source extension region 503 are formed oppositely adjacent to channel region 506 in the active surface of substrate 500, and spacer 516 is formed on a sidewall of gate electrode 514, covering a part of drain extension region 501 and source extension region 503. The drain extension region 501 and source extension region 503 are formed by ion implantation, plasma immersion ion implantation (PIII), or other known techniques. Spacer 516 is preferably formed by depositing a spacer material layer (not shown) such as silicon nitride or silicon dioxide, and selectively etching the spacer material layer. Spacer 516 is silicon nitride in accordance with the third embodiment of the present invention.

Figure 6D:
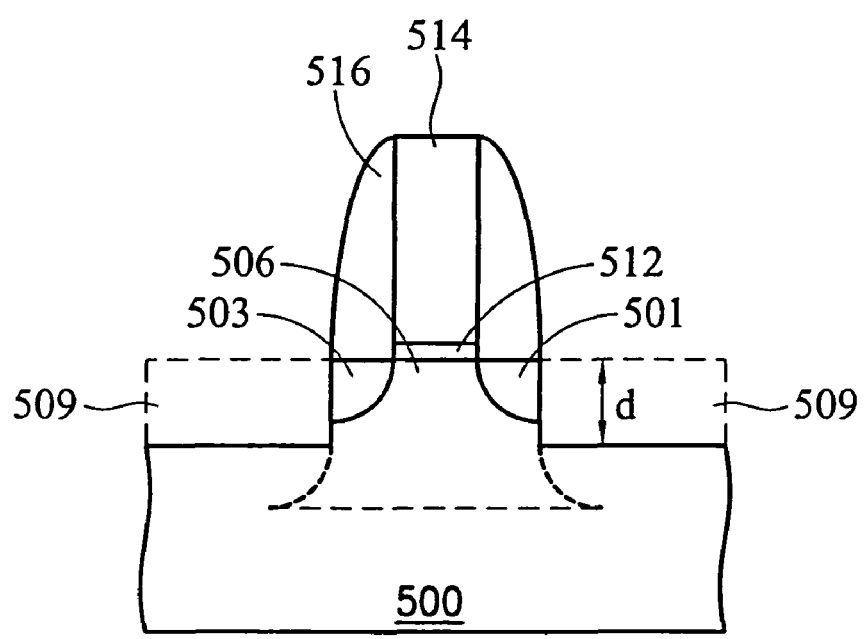
Figure 6E:
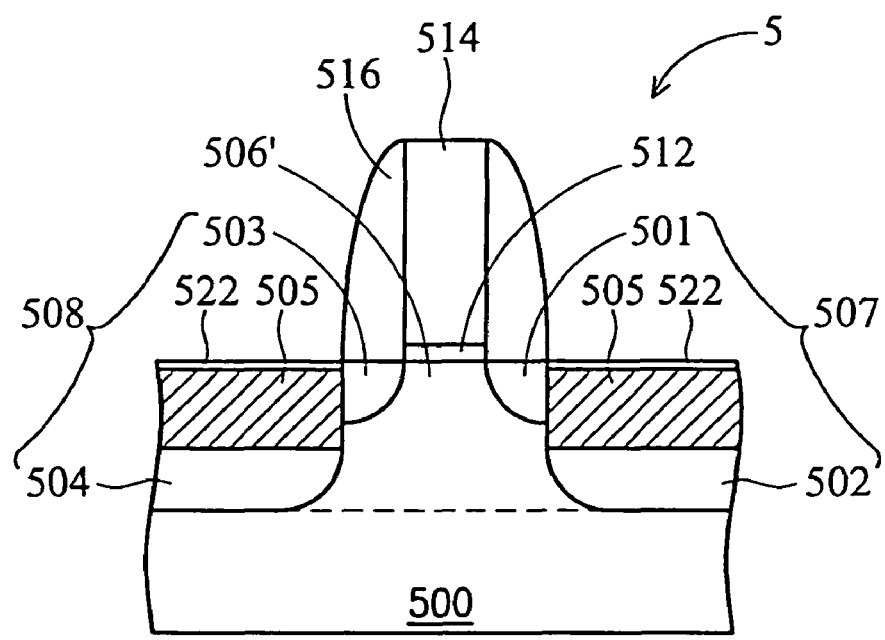

In FIG. 6D, a part or all of the active surface of substrate 500 not covered by gate dielectric layer 512 and spacer 516 is recessed to form at least one recess 509 with a depth d by plasma etching using chlorine and bromine chemistry. The depth d of recess 509 is about 50 Å to 1000 Å. An optional anneal may be performed to facilitate silicon migration to repair etch damage caused by etching recess 509 to smooth the surface of recess 509 for a subsequent epitaxy process.

In FIG. 6E, recess 509 is filled with a semiconductor material such as silicon-germanium alloy or silicon-carbon alloy to form a lattice-mismatched zone 505, and then a deeper drain region 502 is formed adjacent to the drain extension region 501 and a deeper source region 504 is formed adjacent to the source extension region 503. Deeper drain region 502 combines with drain extension region 501 to form a drain region 507, and deeper source region 504 combines with source extension region 503 to form a source region 508. One or both of the drain region 507 and source region 508 comprise the lattice-mismatched zone 505. Channel region 506 is strained to be a strained channel region 506' when lattice-mismatched zone 505 is formed. Thus, strained-channel transistor structure 5 in accordance with the third embodiment of the present invention is basically formed. Lattice-mismatched zone 505 is formed using an epitaxy process such as chemical vapor deposition, ultra-high vacuum chemical vapor deposition, or molecular beam epitaxy. Lattice-mismatched zone 505 comprises silicon-germanium alloy where molar fraction of germanium is about 0.1 to 0.9 when strained-channel transistor structure 5 is a P-channel transistor structure. When strained-channel transistor structure 5 is an N-channel transistor structure, lattice-mismatched zone 505 comprises silicon-carbon alloy where molar fraction of carbon is between about 0.01 and 0.04, and may further comprise germanium to be silicon-carbon-germanium alloy where molar fraction of germanium is less than ten times that of carbon. A silicon cap 522 is optionally formed on lattice-mismatched zone 505 using an epitaxy process such as chemical vapor deposition, ultra-high vacuum chemical vapor deposition, or molecular beam epitaxy. Lattice-mismatched zone 505 and optional silicon cap 522 may be in-situ doped or undoped during the epitaxy process. When lattice-mismatched zone 505 and optional silicon cap 522 are undoped during the epitaxy process, they will be subsequently doped, with dopants activated using a rapid thermal annealing process. Deeper drain region 502 and deeper source region 504 are formed using ion implantation, PIII, gas or solid source diffusion, or other known techniques. An annealing step is further added to recover implant damage or amorphization during formation of lattice-mismatched zone 505, silicon cap 522, deeper drain region 502, and deeper source region 504.

Figure 6F:
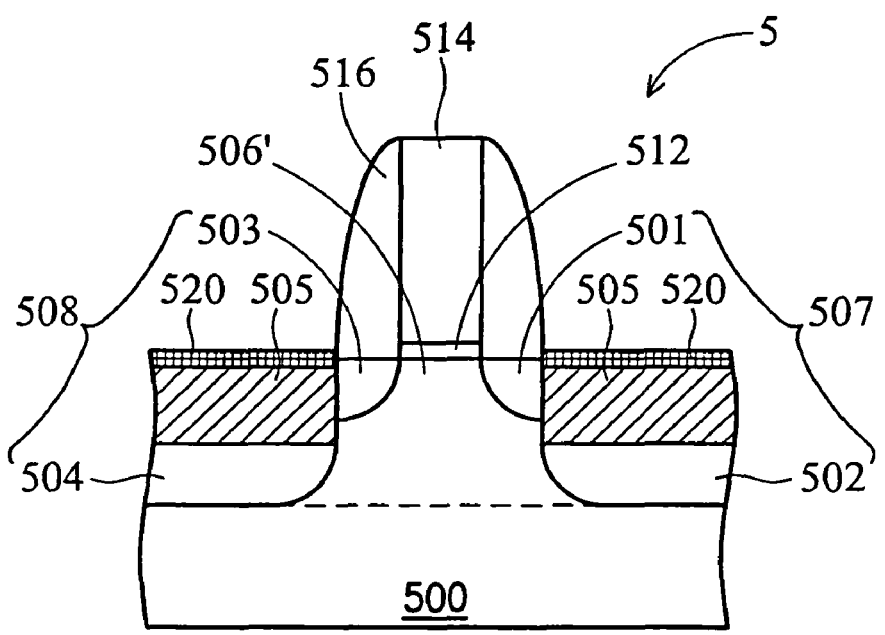

In FIG. 6F, a conductive layer 520 is optionally formed on lattice-mismatched zone 505 and/or drain region 507/source region 508 to reduce resistances of drain region 507 and source region 508. Conductive layer 520 is formed using self-aligned silicide, or other metal deposition process. Passivation layers and device contacts are subsequently formed so as to finish a device comprising strained-channel transistor structure 5 in accordance with the third embodiment of the present invention.

Fourth Embodiment

Figure 7:
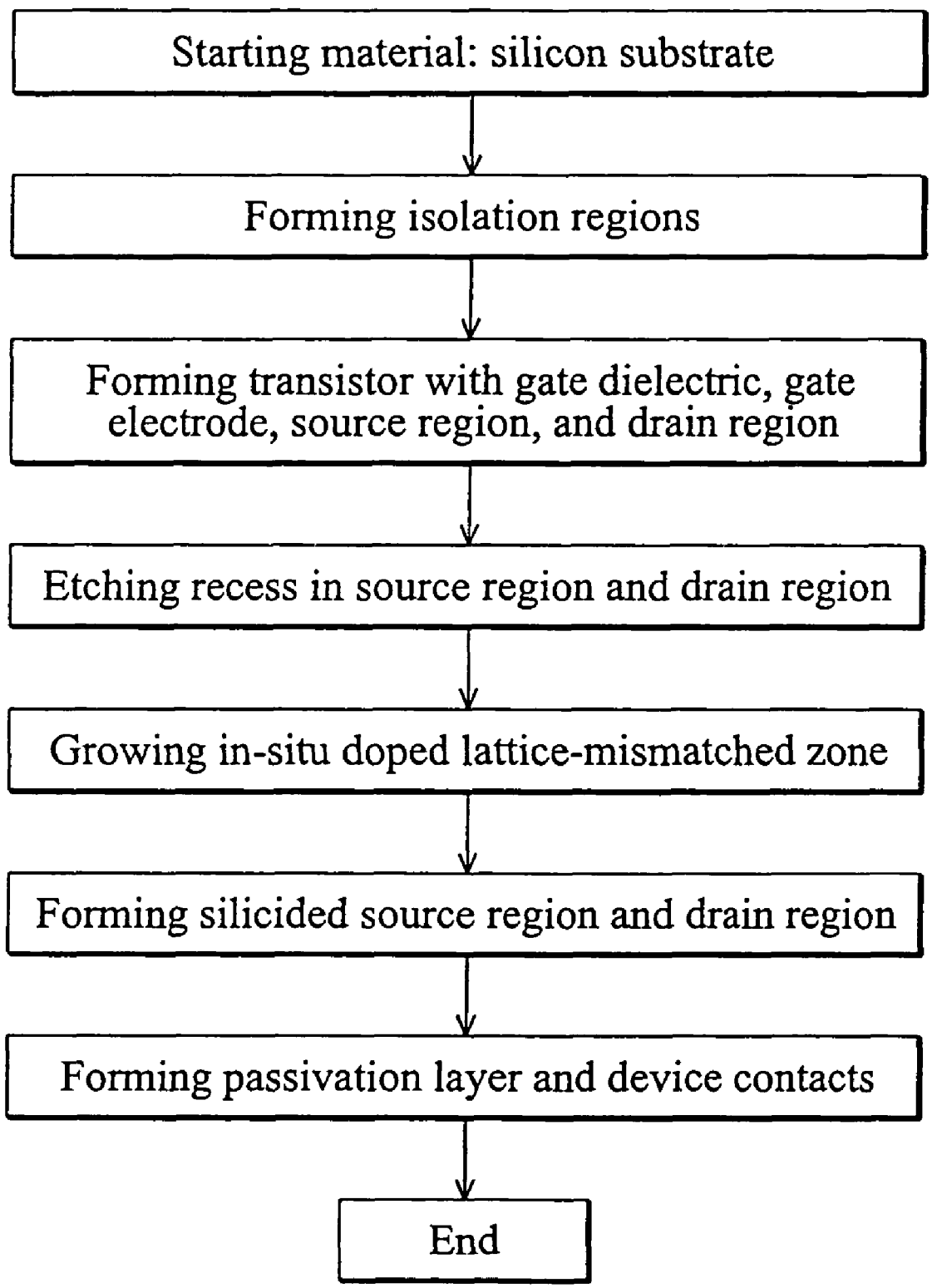
FIG. 7 is a flowchart illustrating, in detail, the fabrication method of a strained-channel transistor structure in accordance with the fourth embodiment of the present invention.

In the fourth embodiment of the present invention, a fabrication method of a strained-channel transistor structure where lattice-mismatched zone does not extend into drain extension region and/or source extension region according to the present invention is described. A flowchart of the fabrication method in accordance with the fourth embodiment of the present invention is shown in FIG. 7. The subsequent descriptions of the fabrication method in accordance with the fourth embodiment of the present invention follow the steps in FIG. 7.

Figure 8A:
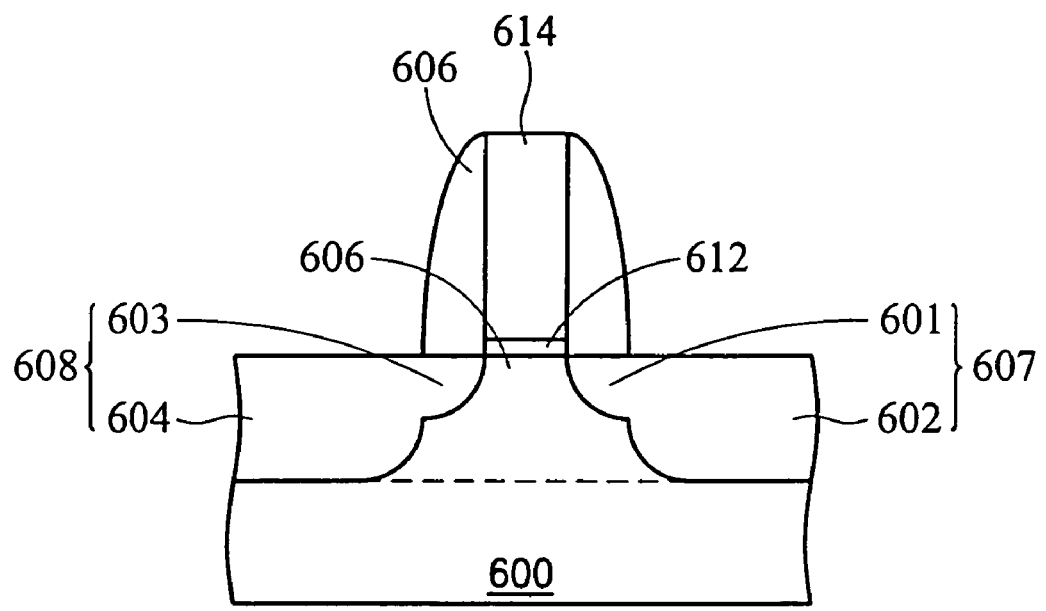
FIGS. 8A through 8D are cross sections illustrating steps of the fabrication method of a strained-channel transistor structure in accordance with the fourth embodiment of the present invention.

In FIG. 8A, a semiconductor substrate such as a silicon substrate 600 is provided. Silicon substrate 600 comprises a previously formed plurality of isolation regions (not shown) and previously defined plurality of device regions (not shown). For example, the isolation regions may be shallow trench isolation regions. FIGS. 8A through 8D provide a cross-sectional view of one single device region for easy description. Silicon substrate 600 comprises a conventional transistor structure comprising a channel region 606 in an active surface of substrate 600, a gate dielectric layer 612 on channel region 606, a gate electrode 614 on gate-dielectric layer 612, a source region 608 and drain region 607 oppositely adjacent to channel region 606, and a spacer 616 on a sidewall of gate electrode 614, covering a part of the active surface of substrate 600. Drain region 607 comprises a drain extension region 601 and a deeper drain region 602, and source region 608 comprises a source extension region 603 and a deeper source region 604. Silicon substrate 600 is N-type doped when strained-channel transistor structure 6 in FIG. 8C is a P-channel transistor structure, or P-type doped when strained-channel transistor structure 6 in FIG. 8C is an N-channel transistor structure.

Figure 8B:
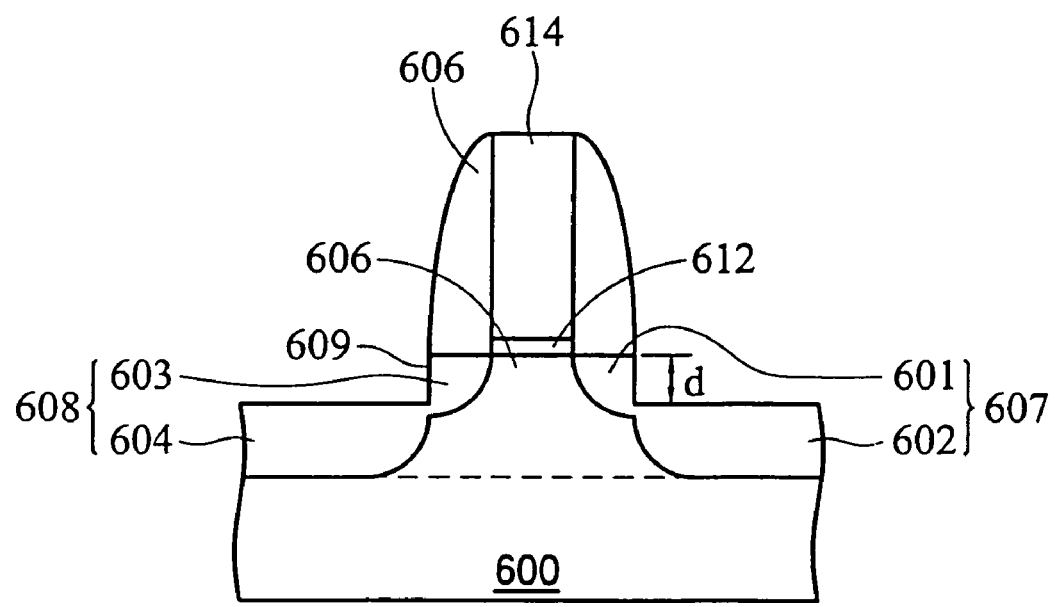
Figure 8C:
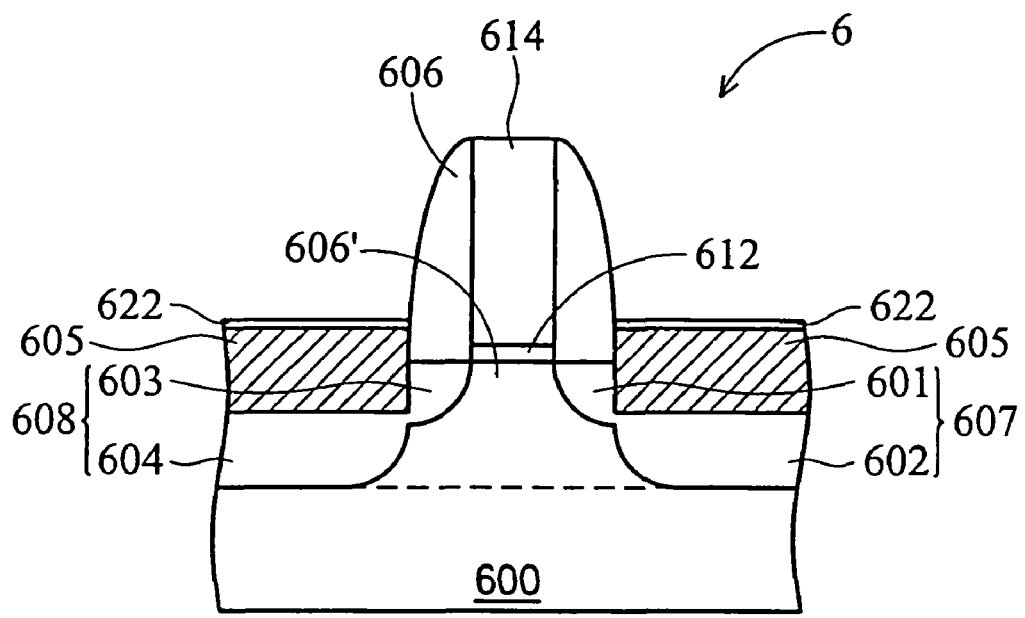

In FIG. 8B, a part or all of the active surface of substrate 600 not covered by gate dielectric layer 612 and spacer 616 is recessed to form at least one recess 609 with a depth d by plasma etching using chlorine and bromine chemistry. The depth d of recess 609 is about 50 Å to 1000 Å. An optional anneal may be performed to facilitate silicon migration to repair etch damage caused by etching recess 609 to smooth the surface of recess 609 for a subsequent epitaxy process.

In FIG. 8C, recess 609 is filled with a semiconductor material such as silicon-germanium alloy or silicon-carbon alloy to form a lattice-mismatched zone 605. One or both of the drain region 607 and source region 608 comprise the lattice-mismatched zone 605. Channel region 606 is strained to be a strained channel region 606' when lattice-mismatched zone 605 is formed. Thus, strained-channel transistor structure 6 in accordance with the fourth embodiment of the present invention is basically formed. Lattice-mismatched zone 605 may protrude from the surface of drain region 607 and/or source region 608, forming a raised drain region and raised source region. Lattice-mismatched zone 605 is formed using an epitaxy process such as chemical vapor deposition, ultra-high vacuum chemical vapor deposition, or molecular beam epitaxy. Lattice-mismatched zone 605 comprises silicon-germanium alloy where molar fraction of germanium is about 0.1 to 0.9 when strained-channel transistor structure 6 is a P-channel transistor structure. When strained-channel transistor structure 6 is an N-channel transistor structure, lattice-mismatched zone 605 comprises silicon-carbon alloy where molar fraction of carbon is between about 0.01 and 0.04, and may further comprise germanium to be silicon-carbon-germanium alloy where molar fraction of germanium is less than ten times that of carbon. A silicon cap 622 is optionally formed on lattice-mismatched zone 605 using an epitaxy process such as chemical vapor deposition, ultra-high vacuum chemical vapor deposition, or molecular beam epitaxy. Lattice-mismatched zone 605 and optional silicon cap 622 are in-situ doped during the epitaxy process.

Figure 8D:
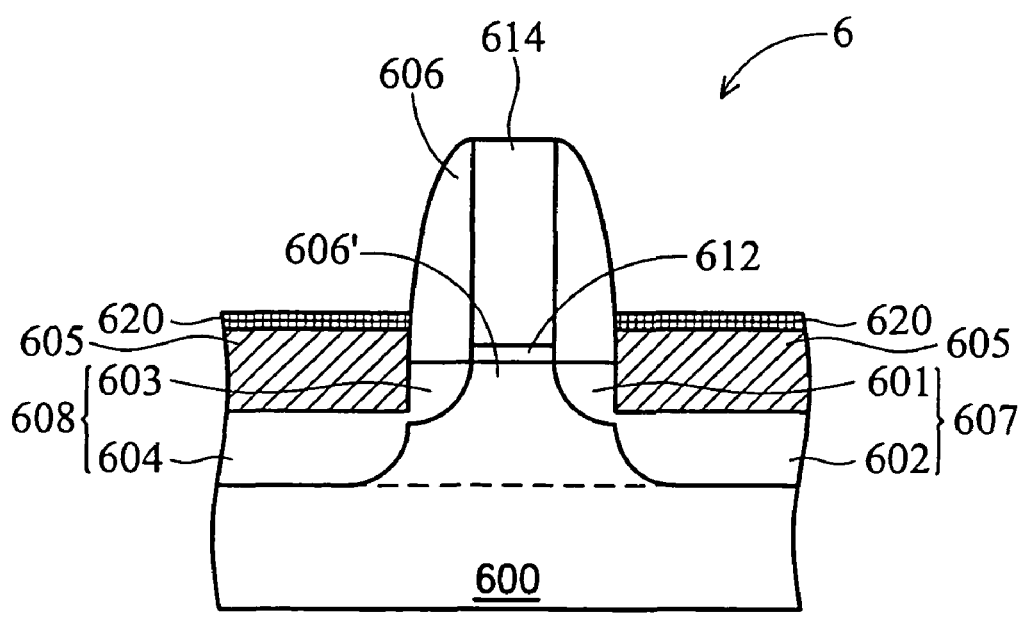

In FIG. 8D, a conductive layer 620 is optionally formed on lattice-mismatched zone 605 and/or drain region 607/source region 608 to reduce resistances of drain region 607 and source region 608. Conductive layer 620 is formed using self-aligned silicide, or other metal deposition process. Passivation layers and device contacts are subsequently formed so as to finish a device comprising strained-channel transistor structure 6 in accordance with the fourth embodiment of the present invention.

Fifth Embodiment

Figure 9:
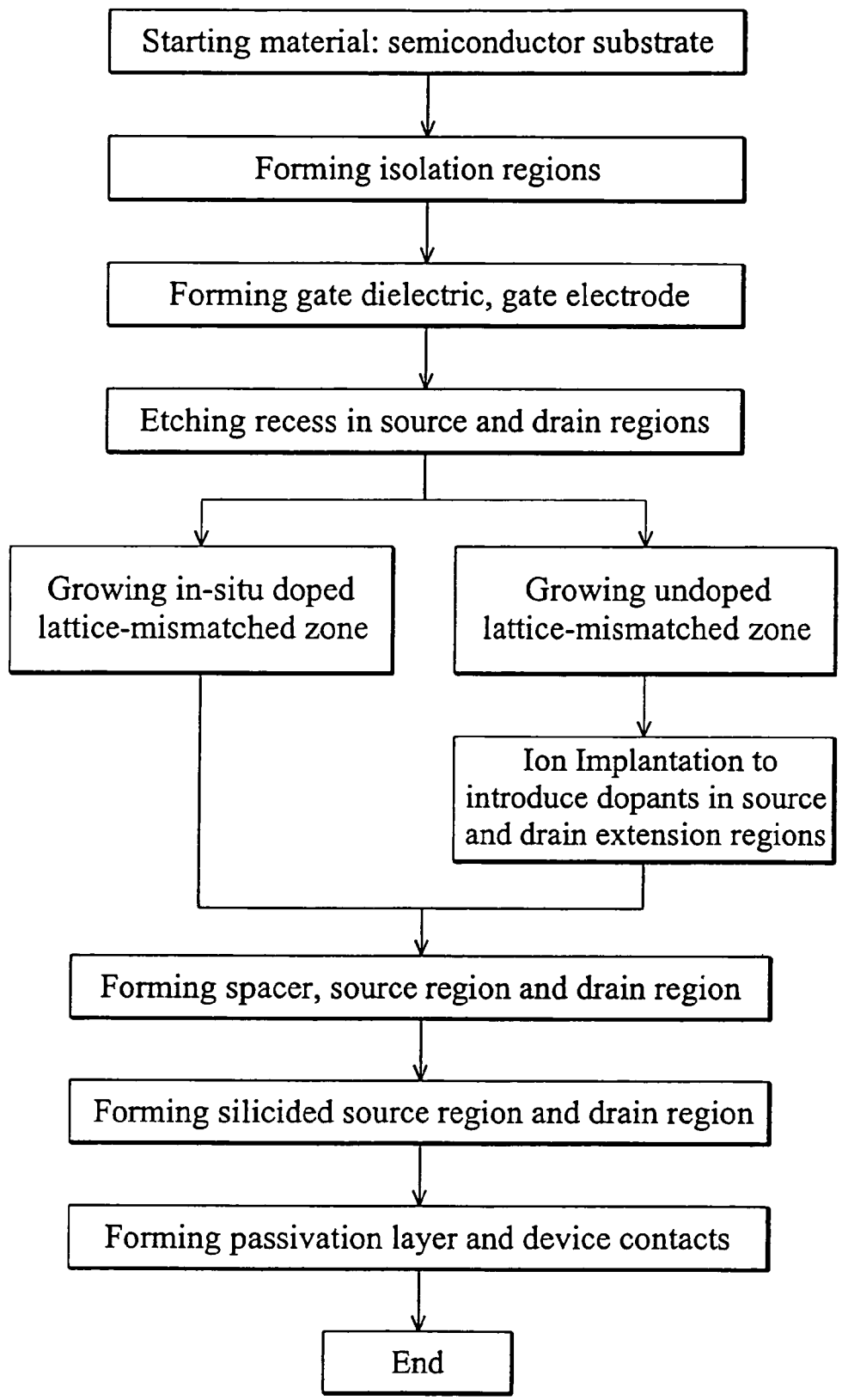
FIG. 9 is a flowchart illustrating, in detail, the fabrication method of a strained-channel transistor structure in accordance with the fifth embodiment of the present invention.

In the fifth embodiment of the present invention, a fabrication method of a strained-channel transistor structure where lattice-mismatched zone extends into drain extension region and/or source extension region according to the present invention is described. A flowchart of the fabrication method in accordance with the fifth embodiment of the present invention is shown in FIG. 9. The subsequent descriptions of the fabrication method in accordance with the fifth embodiment of the present invention follow the steps in FIG. 9.

Figure 10A:
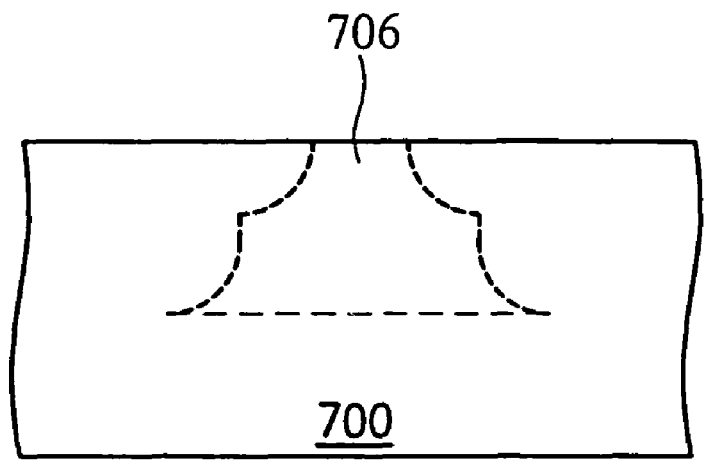
FIGS. 10A through 10G are cross sections illustrating steps of the fabrication method of a strained-channel transistor structure in accordance with the fifth embodiment of the present invention.

In FIG. 10A, a semiconductor substrate such as a silicon substrate 700 is provided. Silicon substrate 700 comprises a previously formed plurality of isolation regions (not shown) and previously defined plurality of device regions (not shown) For example, the isolation regions may be shallow trench isolation regions. FIGS. 10A through 10G provide a cross-sectional view of one single device region for easy description. Silicon substrate 700 comprises a channel region 706 in an active surface. Silicon substrate 700 is N-type doped when strained-channel transistor structure 7 in FIG. 10D is a P-channel transistor structure, or P-type doped when strained-channel transistor structure 7 in FIG. 10D is an N-channel transistor structure.

Figure 10B:
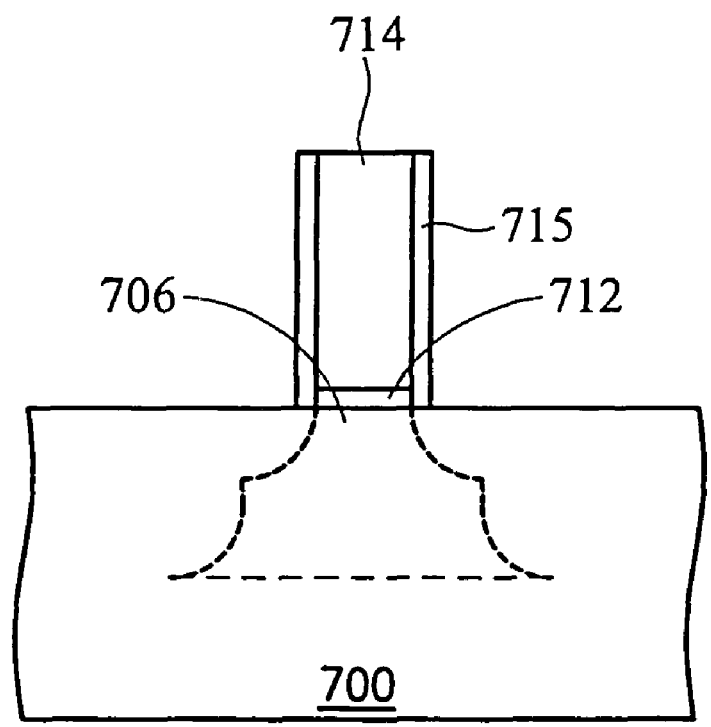

In FIG. 10B, first, a gate dielectric layer 712 is formed on the channel region 706, and a gate electrode 714 is formed on the gate dielectric layer 712. Finally, spacer 715 is formed on a sidewall of gate electrode 714, covering a part of the active surface of substrate 700. Gate dielectric layer 712 is formed by thermal oxidation, thermal oxidation followed by nitridation, chemical vapor deposition, physical vapor deposition such as sputtering, or other known techniques to form a gate dielectric layer. Gate dielectric layer 712 is preferably silicon dioxide, silicon oxynitride, or combinations thereof with a thickness between about 3 Å to 100 Å, preferably approximately 10 Å or less. Gate dielectric layer 712 may be a high permittivity (high-k) material such as aluminum oxide (Al2O3), hafnium oxide (HfO2), zirconium oxide (ZrO2), hafnium oxynitride (HfON), hafnium silicate (HfSiO4), zirconium silicate (ZrSiO4), lanthanum oxide (La2O3), or combinations thereof with an equivalent oxide thickness between about 3 Å to 100 Å. Gate electrode 714 is polycrystalline-silicon (poly-Si), poly-crystalline silicon-germanium (poly-SiGe), refractory metal such as molybdenum or tungsten, compounds such as titanium nitride, combinations thereof or other conductive material(s). Implants known as workfunction implants may be introduced in gate electrode 714 to alter the workfunction thereof. Gate electrode 714 is formed by depositing a gate electrode material layer (not shown) over substrate 700, depositing a gate mask (not shown) over the gate electrode material layer, patterning the gate mask to define gate electrode 714, etching the gate electrode material layer to form gate electrode 714, and removing the gate mask. Gate electrode 714 is electrically isolated from channel region 706 by gate dielectric layer 712. Gate dielectric layer 712 is preferably silicon oxynitride and gate electrode 714 is poly-silicon etched using chlorine and bromine chemistry with a high etch selectivity with respect to gate dielectric later 714 in accordance with the fifth embodiment of the present invention. Spacer 715 is formed using a deposition and anisotropic etching technique for protecting the sidewall of gate electrode 714 during a subsequent epitaxy step.

Figure 10C:
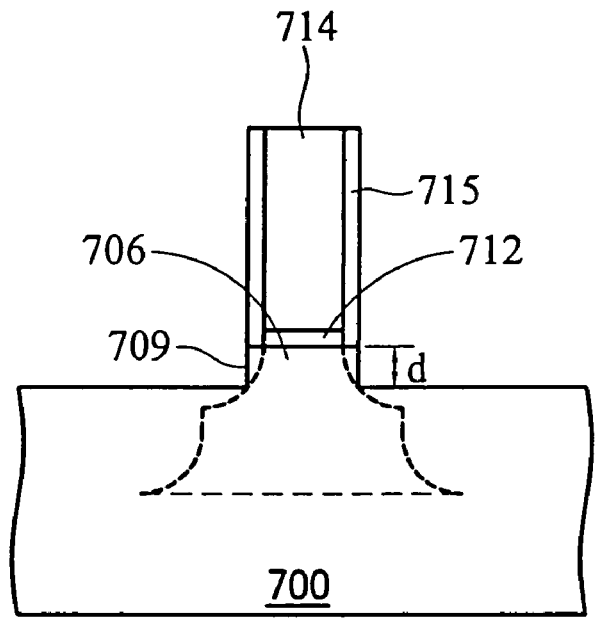
Figure 10D:
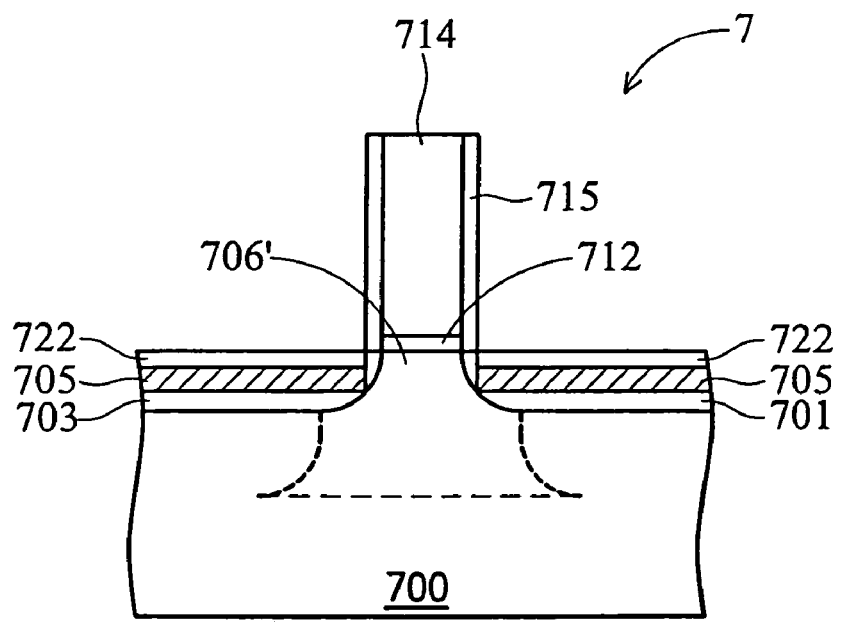

In FIG. 10C, a part or all of the active surface of substrate 700 not covered by gate dielectric layer 712 and spacer 715 is recessed to form at least one recess 709 with a depth d by plasma etching using chlorine and bromine chemistry. The depth d of recess 709 is about 50 Å to 1000 Å. An optional anneal may be performed to facilitate silicon migration to repair etch damage caused by etching recess 709 to smooth the surface of recess 709 for a subsequent epitaxy process.

In FIG. 10D, recess 709 is filled with a semiconductor material such as silicon-germanium alloy or silicon-carbon alloy to form a lattice-mismatched zone 705, and then a drain extension region 701 and source extension region 703 are formed oppositely adjacent to the strained channel region 706'. Thus, strained-channel transistor structure 7 in accordance with the fifth embodiment of the present invention is basically formed. Lattice-mismatched zone 705 is formed using an epitaxy process such as chemical vapor deposition, ultra-high vacuum chemical vapor deposition, or molecular beam epitaxy. Channel region 706 is strained to be a strained channel region 706' when lattice-mismatched zone 705 is formed. Lattice-mismatched zone 705 comprises silicon-germanium alloy where molar fraction of germanium is about 0.1 to 0.9 when strained-channel transistor structure 7 is a P-channel transistor structure. When strained-channel transistor structure 7 is an N-channel transistor structure, lattice-mismatched zone 705 comprises silicon-carbon alloy where molar fraction of carbon is between about 0.01 and 0.04, and may further comprise germanium to be silicon-carbon-germanium alloy where molar fraction of germanium is less than ten times that of carbon. A silicon cap 722 is optionally formed on lattice-mismatched zone 705 using an epitaxy process such as chemical vapor deposition, ultra-high vacuum chemical vapor deposition, or molecular beam epitaxy. Lattice-mismatched zone 705 and optional silicon cap 722 may be in-situ doped or undoped during the epitaxy process. When lattice-mismatched zone 705 and optional silicon cap 722 are undoped during the epitaxy process, but will be doped subsequently, at which time dopants will be activated using a rapid thermal annealing process. Drain extension region 701 and source extension region 703 are formed by dopant diffusion from lattice-mismatched zone 705 and optional silicon cap 722. One or both of the drain extension region 701 and source extension region 703 comprise the lattice-mismatched zone 705 and optional silicon cap 722.

Figure 10E:
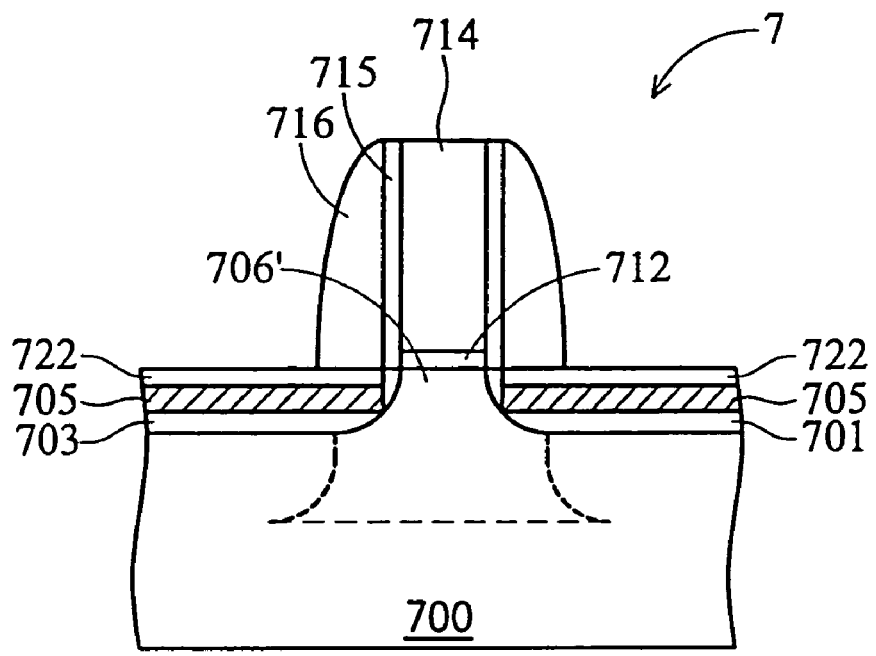

In FIG. 10E, a spacer 716 is formed overlying the spacer 715. Spacer 716 is formed using deposition and selectively etching a spacer material (not shown) such as silicon nitride or silicon dioxide. Spacer 716 is silicon nitride in accordance with the fifth embodiment of the present invention.

Figure 10F:
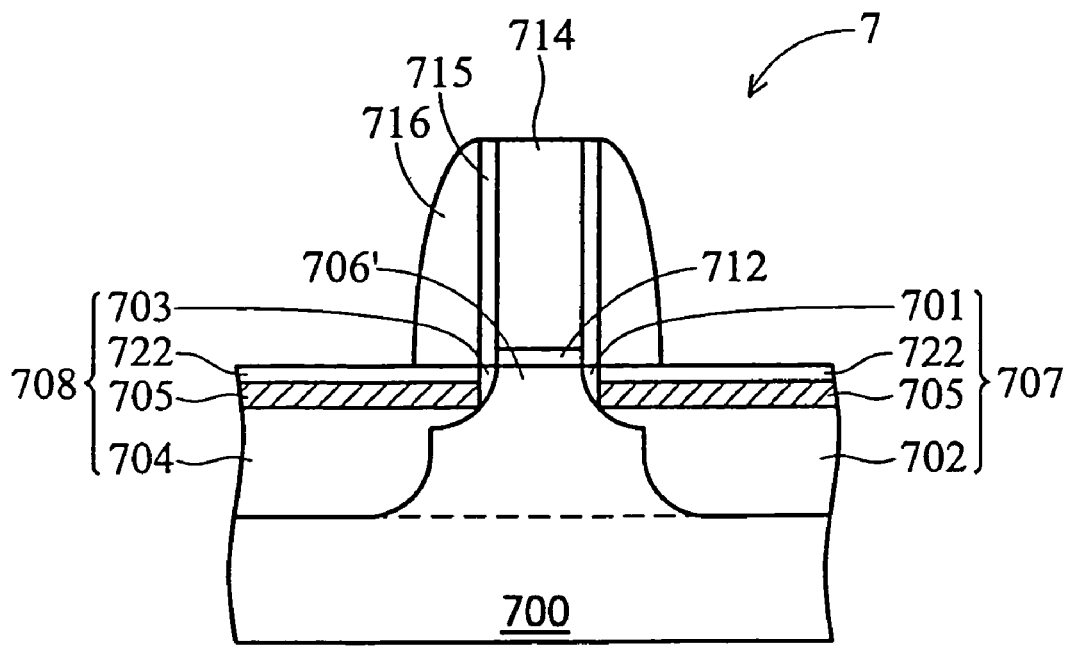

In FIG. 10F, a deeper drain region 702 is formed adjacent to drain extension region 701, and deeper source region 704 is formed adjacent to source extension region 703. Deeper drain region 702 combines with drain extension region 701, lattice-mismatched zone 705 when available, and optional silicon cap 722 when available to be a drain region 707, and deeper source region 704 combines with source extension region 703, lattice-mismatched zone 705 when available, and optional silicon cap 722 when available to be a source region 708. Deeper drain region 702 and deeper source region 704 are formed using ion implantation, PIII, gas or solid source diffusion, or other known techniques.

Figure 10G:
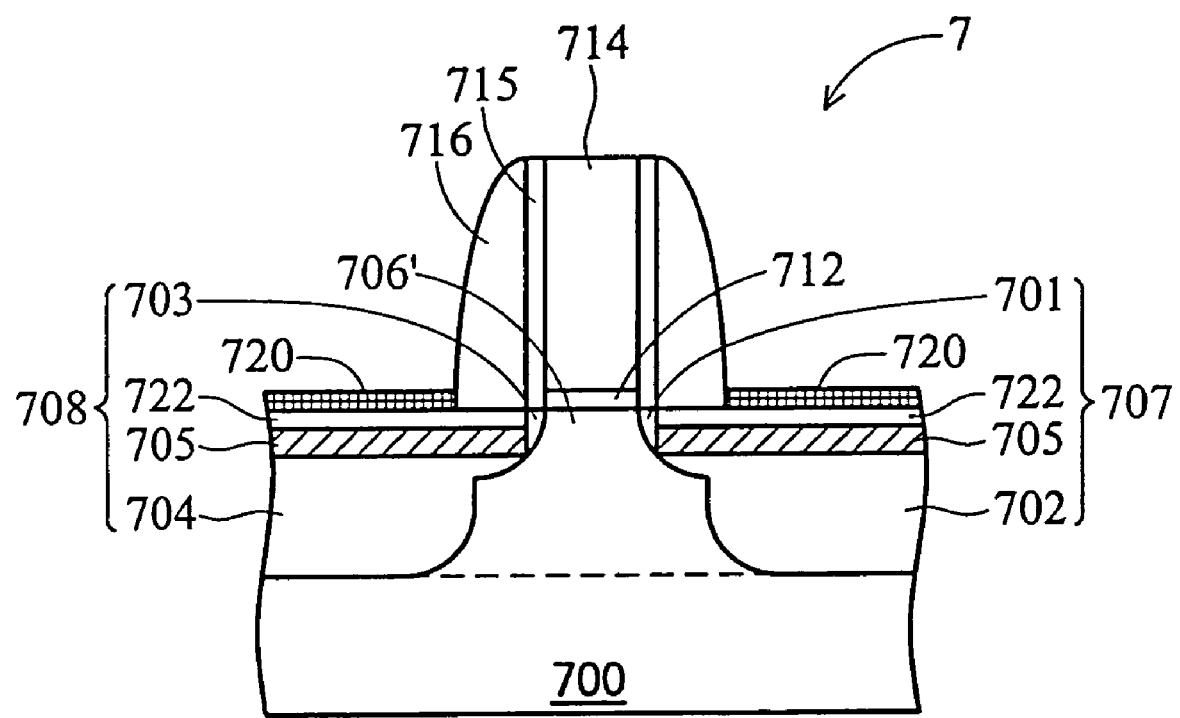

In FIG. 10G, a conductive layer 720 is optionally formed on drain region 707 and source region 708 to reduce resistances of drain region 707 and source region 708. Conductive layer 720 is formed using self-aligned silicide, or other metal deposition. Passivation layers and device contacts are subsequently formed so as to finish a device comprising strained-channel transistor structure 7 in accordance with the fifth embodiment of the present invention.

Sixth Embodiment

In the sixth embodiment of the present invention, a fabrication method of a strained-channel transistor structure where lattice-mismatched zone is formed using an ion implantation process according to the present invention is described.

Figure 11A:
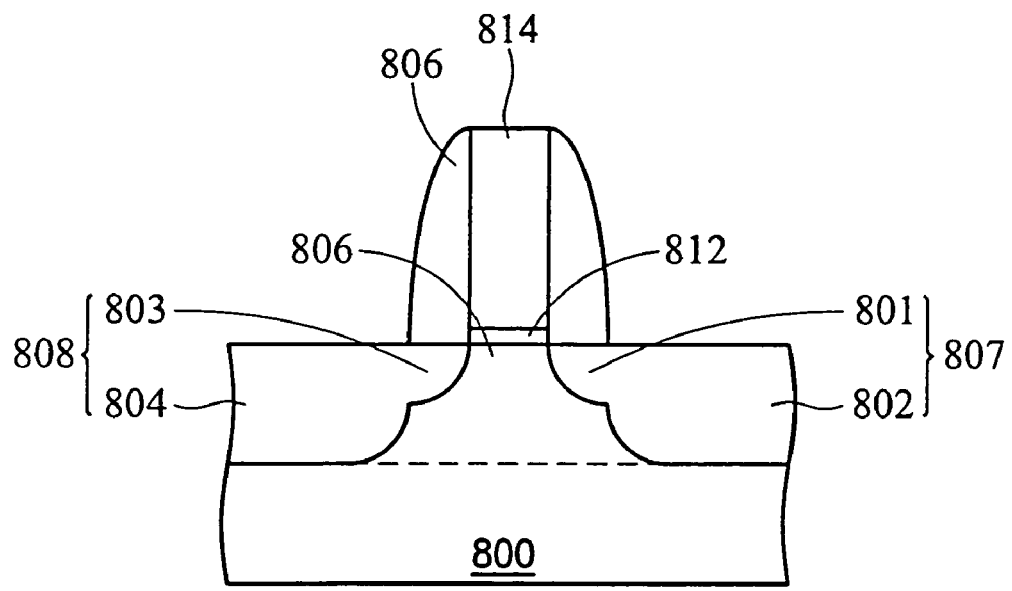
FIGS. 11A through 11D are cross sections illustrating steps of the fabrication method of a strained-channel transistor structure in accordance with the sixth embodiment of the present invention.
Figure 11B:
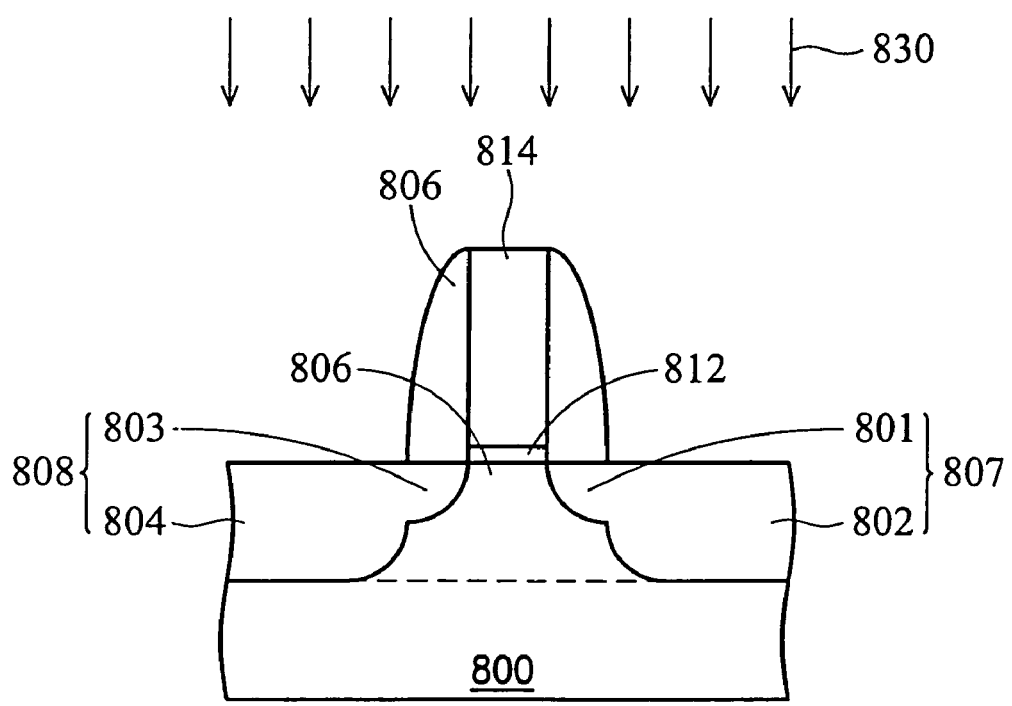
Figure 11C:
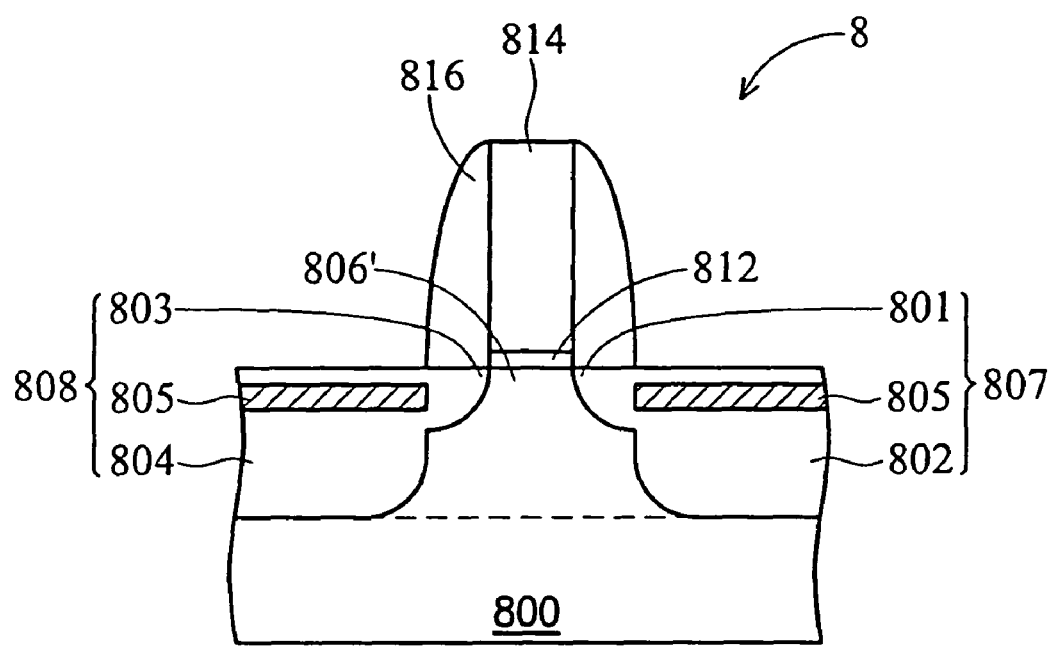

In FIG. 11A, a semiconductor substrate such as a silicon substrate 800 is provided. Silicon substrate 800 comprises a previously formed plurality of isolation regions (not shown) and previously defined plurality of device regions (not shown). For example, the isolation regions may be shallow trench isolation regions. FIGS. 11A through 11D provide a cross-sectional view of one single device region for easy description. Silicon substrate 800 comprises a conventional transistor structure comprising a channel region 806 in an active surface of substrate 800, a gate dielectric layer 812 on channel region 806, a gate electrode 814 on gate dielectric layer 812, a source region 808 and drain region 807 oppositely adjacent to channel region 806, and a spacer 816 on a sidewall of gate electrode 814, covering a part of the active surface of substrate 800. Drain region 807 comprises a drain extension region 801 and a deeper drain region 802, and source region 808 comprises a source extension region 803 and a deeper source region 804. Silicon substrate 800 is N-type doped when strained-channel transistor structure 8 in FIG. 11C is a P-channel transistor structure, or P-type doped when strained-channel transistor structure 8 in FIG. 11C is an N-channel transistor structure.

Figure 1A:
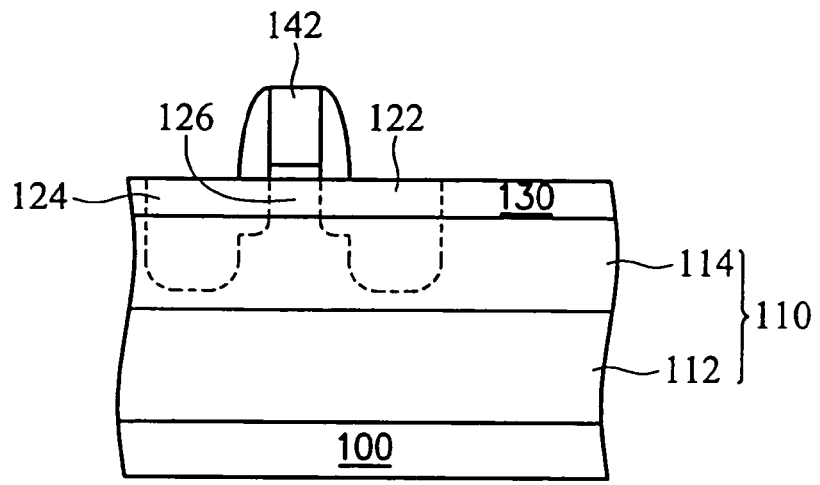
FIGS. 1A through 1C are cross sections illustrating a conventional strained silicon transistor with a relaxed SiGe layer as a stressor to induce strain in the top epitaxial strained silicon layer.
Figure 1B:
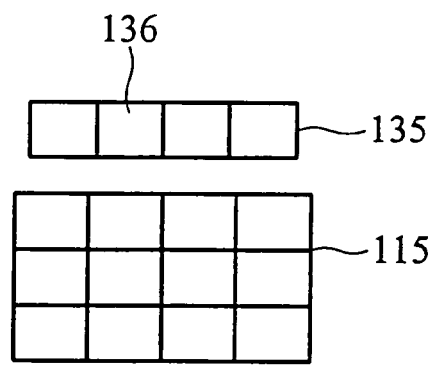
Figure 1C:
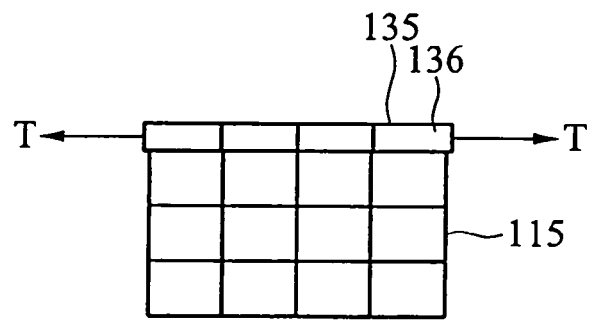
Figure 2:
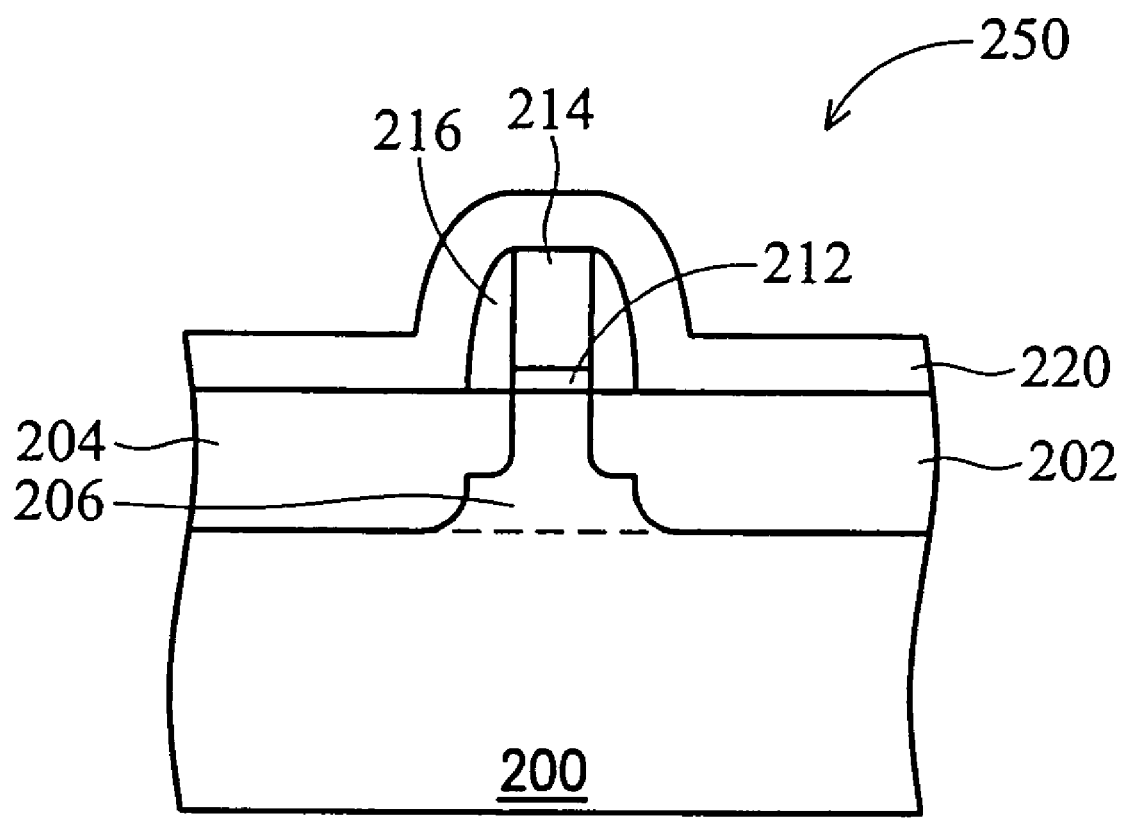
FIG. 2 is a cross section illustrating another conventional strained silicon transistor introducing strain in the channel using a high stress film as a stressor.

In FIG. 1B, an ion implantation process is performed to introduce ions 830 of one or more atomic species with a different atomic size from that of substrate 800 into drain region 807 and/or source region 808. Gate electrode 814 and spacer 816 act as a implantation mask during the ion implantation process. Thickness of spacer 816 is adjustable depending on lattice-mismatched zone 805 in FIG. 11C either extending into drain extension region 801 and/or source extension region 803, or not extending into drain extension region 801 and/or source extension region 803., as required.

In FIG. 11C, an annealing step is performed on the substrate 800 to form a lattice-mismatched zone in one or both of drain region. 807 and source region 808. Thus, one or both of the drain region 807 and source region 808 comprise the lattice-mismatched zone 805. Channel region 806 is strained to be a strained channel region 806' when lattice-mismatched zone 805 is formed. Thus, strained channel transistor structure 8 in accordance with the sixth embodiment of the present invention is basically formed. Lattice-mismatched zone 805 comprises silicon-germanium alloy where molar fraction of germanium is about 0.1 to 0.9 when strained-channel transistor structure 8 is a P-channel transistor structure. When strained-channel transistor structure 8 is an N-channel transistor structure, lattice-mismatched zone 805 comprises silicon-carbon alloy where molar fraction of carbon is between about 0.01 and 0.04, and may further comprise germanium to be silicon-carbon-germanium alloy where molar fraction of germanium is less than ten times that of carbon.

Figure 11D:
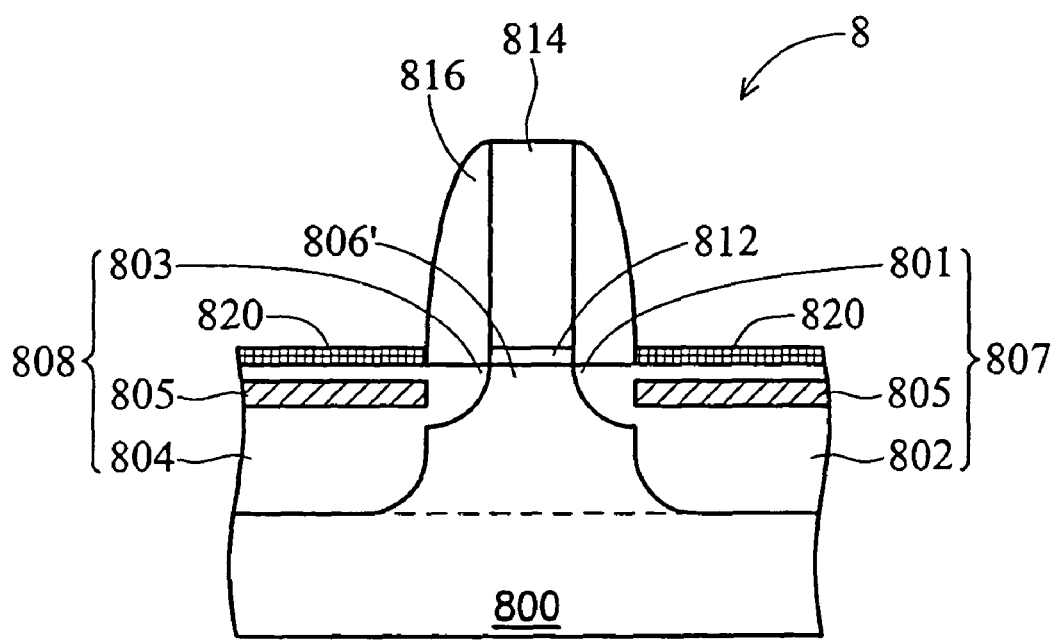

In FIG. 11D, a conductive layer 820 is optionally formed on drain region 807 and source region 808 to reduce resistances of drain region 807 and source region 808. Conductive layer 820 is formed using self-aligned silicide, or other metal deposition process. Passivation layers and device contacts are subsequently formed so as to finish a device comprising strained-channel transistor structure 8 in accordance with the sixth embodiment of the present invention.

Although the present invention has been particularly shown and described above with reference to six specific embodiments, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:
1. A method of fabrication a strained-channel transistor structure with improved transport properties, comprising:
 providing a substrate having a first semiconductor material with a first natural lattice constant, a gate dielectric layer on the substrate, a gate electrode on the gate dielectric layer, and a first spacer on a sidewall of the gate electrode;
 recessing the surface of the substrate not covered by the spacer and gate dielectric layer to form a recess;

filling the recess with a second semiconductor material with a second natural lattice constant different from the first natural lattice constant as a lattice-mismatched zone;

forming a cap layer on the second semiconductor material, the cap layer comprising the first semiconductor material with the first natural lattice constant; and forming a first source region and a first drain region oppositely adjacent to the gate dielectric layer, one or both of the first source region and the first drain region comprising the lattice-mismatched zone and the cap layer;

forming a second spacer overlying the first spacer; and forming a second source region adjacent to the first source region and second drain region adjacent to the first drain region, wherein the first semiconductor material is silicon.

2. The method as claimed in claim 1, wherein the second semiconductor material is in-situ doped when filling the recess.

3. The method as claimed in claim 1, wherein the first source region and first drain region are formed by ion implantation or plasma immersion ion implantation.

4. The method as claimed in claim 1, wherein the second semiconductor material comprises silicon and germanium.

5. The method as claimed in claim 1, wherein the second semiconductor material comprises silicon and carbon.

6. The method as claimed in claim 4, wherein molar fraction of germanium in the second semiconductor material is about 0.1 to about 0.9.

7. The method as claimed in claim 5, wherein molar fraction of carbon in the second semiconductor material is about 0.01 to about 0.04.

8. The method as claimed in claim 1, wherein the recess is about 50 to about 1000 Å deep.

9. The method as claimed in claim 1, wherein the second semiconductor material is filled in the recess by an epitaxy process using chemical vapor deposition, ultra-high vacuum chemical vapor deposition, or molecular beam epitaxy.

10. The method as claimed in claim 1, wherein the gate dielectric layer comprises silicon oxide or silicon oxynitride.

11. The method as claimed in claim 1, wherein the gate dielectric layer comprises Al2O3, HfO2, ZrO2, HfON, HfSiO4, ZrSiO4, La2O3, or combinations thereof.

12. The method as claimed in claim 1, wherein the relative permittivity of the gate dielectric layer is larger than about 5.

13. The method as claimed in claim 1, wherein the gate electrode comprises poly-crystalline silicon.

14. The method as claimed in claim 1, wherein the gate electrode comprises a metal.

15. The method as claimed in claim 1, wherein the gate electrode comprises a metal silicide.

16. The method as claimed in claim 1, wherein the second semiconductor material is undoped when filling the recess.

17. The method as claimed in claim 1, wherein the recess is formed by plasma etching.

18. A method of fabrication a strained-channel transistor structure with improved transport properties, comprising:

providing a substrate comprising a first semiconductor material with a first natural lattice constant, a gate dielectric layer on the substrate, a gate electrode on the gate dielectric layer, a source region and drain region oppositely adjacent to the gate dielectric layer, and a spacer on a sidewall of the gate electrode;

recessing one or both of the source region and drain region to form a recess;

filling the recess with a second semiconductor material with a second natural lattice constant different from the first natural lattice constant as a lattice-mismatched zone; and forming a cap layer on the second semiconductor material, the cap layer comprising the first semiconductor material with the first natural lattice constant;

forming another spacer overlying the spacer; and forming another source region adjacent to the source region and another drain region adjacent to the drain region, wherein the first semiconductor material is silicon.

19. The method as claimed in claim 18, wherein the second semiconductor comprises silicon and germanium.

20. The method as claimed in claim 18, wherein the second semiconductor comprises silicon and carbon.

21. The method as claimed in claim 19, wherein molar fraction of germanium in the second semiconductor material is about 0.1 to 0.9.

22. The method as claimed in claim 20, wherein molar fraction of carbon in the second semiconductor material is about 0.01 to 0.04.

23. The method as claimed in claim 18, wherein the recess is formed by plasma etching.

24. The method as claimed in claim 18, wherein the recess is about 50 to 1000 Å deep.

25. The method as claimed in claim 18, wherein the second semiconductor material is filled in the recess by an epitaxy process using chemical vapor deposition, ultra-high vacuum chemical vapor deposition, or molecular beam epitaxy.

26. The method as claimed in claim 18, wherein the second semiconductor material is in-situ doped when filling the recess.

27. The method as claimed in claim 18, wherein the gate dielectric layer comprises silicon oxide or silicon oxynitride.

28. The method as claimed in claim 18, wherein the gate dielectric layer comprises Al2O3, HfO2, ZrO2, HfON, HfSiO4, ZrSiO4, La2O3, or combinations thereof.

29. The method as claimed in claim 28, wherein the relative permittivity of the gate dielectric layer is larger than 5.

30. The method as claimed in claim 18, wherein the gate electrode comprises poly-crystalline silicon.

31. The method as claimed in claim 18, wherein the gate electrode comprises a metal.

32. The method as claimed in claim 18, wherein the gate electrode comprises a metal silicide.

* * * * *